United States Patent
Peterson et al.

(10) Patent No.: US 10,318,065 B2
(45) Date of Patent: Jun. 11, 2019

(54) INPUT DEVICE HAVING A DIMENSIONALLY CONFIGURABLE INPUT AREA

(71) Applicant: Apple Inc., Cupertino, CA (US)

(72) Inventors: Jonathan R. Peterson, Cupertino, CA (US); Mark A. Bunney, Jr., Cupertino, CA (US); Daniel M. Strongwater, Cupertino, CA (US); Benjamin G. Jackson, Cupertino, CA (US); Thomas S. Hulbert, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 184 days.

(21) Appl. No.: 15/227,753

(22) Filed: Aug. 3, 2016

(65) Prior Publication Data

US 2018/0039376 A1     Feb. 8, 2018

(51) Int. Cl.
    *G09G 5/00*     (2006.01)
    *G06F 3/041*    (2006.01)
    (Continued)

(52) U.S. Cl.
    CPC ............ *G06F 3/0418* (2013.01); *G06F 3/041* (2013.01); *G06F 3/044* (2013.01);
    (Continued)

(58) Field of Classification Search
    CPC ........ G06F 3/0237; G06F 3/041; G06F 3/044; G06F 3/0416; G06F 3/011; H05B 33/0848
    (Continued)

(56) References Cited

U.S. PATENT DOCUMENTS

| 5,212,356 | A | 5/1993 | English |
| 5,748,177 | A | 5/1998 | Baker et al. |

(Continued)

FOREIGN PATENT DOCUMENTS

| CN | 1862732 | 11/2006 |
| CN | 101071354 | 11/2007 |

(Continued)

OTHER PUBLICATIONS

Rekimoto, Jun, "Thumbsense: Automatic Input Mode Sensing for Touch-Based Interactions," Interaction Laboratory, Sony Computer & Science Laboratories, Inc., 2 pages, Apr. 2003.

(Continued)

*Primary Examiner* — Abdul-Samad A Adediran
(74) *Attorney, Agent, or Firm* — Brownstein Hyatt Farber Schreck, LLP

(57) ABSTRACT

Embodiments are directed to a user input device and methods for expanding an input area in response to an estimation of the accuracy of touch input or the likelihood that a series of touches will hit an intended touch target area. In one aspect, an embodiment includes a first capacitive area defined by a first electrode and a second capacitive area defined by the first electrode and a second electrode. The embodiment further includes a processing unit that may be configured to, in a first mode, execute an operation in response to a touch received in the first capacitive area. The processing unit may be configured to, in a second mode, execute the operation in response to the touch received in the second capacitive area.

20 Claims, 9 Drawing Sheets

(51) Int. Cl.
*G06F 3/044* (2006.01)
*H03K 17/96* (2006.01)

(52) U.S. Cl.
CPC ............... *H03K 17/9622* (2013.01); *H03K 2217/94026* (2013.01); *H03K 2217/960705* (2013.01)

(58) Field of Classification Search
USPC ......... 1/1; 345/168, 169, 173, 174; 362/545; 715/816
See application file for complete search history.

(56) References Cited

U.S. PATENT DOCUMENTS

| | | | |
|---|---|---|---|
| 5,920,303 | A | 7/1999 | Baker et al. |
| 6,029,214 | A | 2/2000 | Dorfman et al. |
| 6,429,846 | B2 | 8/2002 | Rosenberg et al. |
| 6,822,640 | B2 | 11/2004 | Derocher |
| 7,683,890 | B2 | 3/2010 | Geaghan |
| 7,834,855 | B2 | 11/2010 | Hotelling et al. |
| 7,847,789 | B2 | 12/2010 | Kolmykov-Zotov et al. |
| 7,901,991 | B2 | 3/2011 | Bonucci et al. |
| 8,063,893 | B2 | 11/2011 | Rosenberg et al. |
| 8,077,057 | B2 | 12/2011 | Ohshita et al. |
| 8,098,233 | B2 | 1/2012 | Hotelling et al. |
| 8,321,810 | B2 | 11/2012 | Heintze |
| 8,335,996 | B2 | 12/2012 | Davidson et al. |
| 8,378,975 | B2 | 2/2013 | Yoon et al. |
| 8,381,118 | B2 | 2/2013 | Minton |
| 8,390,481 | B2 | 3/2013 | Pance et al. |
| 8,432,362 | B2 | 4/2013 | Cheng et al. |
| 8,436,816 | B2 | 5/2013 | Leung et al. |
| 8,441,790 | B2 | 5/2013 | Pance et al. |
| 8,502,800 | B1* | 8/2013 | Vier .................. G06F 3/0416 345/169 |
| 8,537,132 | B2 | 9/2013 | Ng et al. |
| 8,537,140 | B2 | 9/2013 | Tsai et al. |
| 8,570,280 | B2 | 10/2013 | Stewart et al. |
| 8,642,908 | B2 | 2/2014 | Moran et al. |
| 8,654,524 | B2 | 2/2014 | Pance et al. |
| 8,743,083 | B2 | 6/2014 | Zanone et al. |
| 8,766,922 | B2 | 7/2014 | Kim et al. |
| 8,804,347 | B2 | 8/2014 | Martisauskas |
| 8,854,325 | B2 | 10/2014 | Byrd et al. |
| 8,870,812 | B2 | 10/2014 | Alberti et al. |
| 8,952,899 | B2 | 2/2015 | Hotelling |
| 8,963,846 | B2 | 2/2015 | Lii et al. |
| 9,019,207 | B1 | 4/2015 | Hamburgen et al. |
| 9,098,120 | B2 | 8/2015 | Huh |
| 9,104,282 | B2 | 8/2015 | Ichikawa |
| 9,116,616 | B2 | 8/2015 | Kyprianou et al. |
| 9,122,330 | B2 | 9/2015 | Bau et al. |
| 9,195,354 | B2 | 9/2015 | Bulea et al. |
| 9,201,105 | B2 | 12/2015 | Iida et al. |
| 9,213,426 | B2 | 12/2015 | Clifton et al. |
| 9,250,738 | B2 | 2/2016 | Sharma |
| 9,367,146 | B2 | 6/2016 | Piot et al. |
| 9,367,158 | B2 | 6/2016 | Hotelling et al. |
| 9,460,029 | B2 | 10/2016 | Shaw et al. |
| 9,542,097 | B2 | 1/2017 | Ganey et al. |
| 9,543,948 | B2 | 1/2017 | Curtis et al. |
| 9,635,267 | B2 | 4/2017 | Lee et al. |
| 9,753,569 | B2 | 9/2017 | Han et al. |
| 9,847,505 | B2 | 12/2017 | Chida |
| 2004/0104894 | A1 | 6/2004 | Tsukada et al. |
| 2004/0257345 | A1 | 12/2004 | Makanae et al. |
| 2006/0244732 | A1* | 11/2006 | Geaghan .................. G06F 3/041 345/173 |
| 2007/0076859 | A1 | 4/2007 | Tzvetanov |
| 2008/0018611 | A1 | 1/2008 | Serban et al. |
| 2008/0055259 | A1* | 3/2008 | Plocher .................. G06F 3/011 345/173 |
| 2008/0272927 | A1 | 11/2008 | Woolley et al. |
| 2009/0225052 | A1 | 9/2009 | Liu |
| 2010/0033354 | A1 | 2/2010 | Ejlersen |
| 2010/0265183 | A1 | 10/2010 | Mail et al. |
| 2010/0271315 | A1 | 10/2010 | Bathiche |
| 2010/0283741 | A1 | 11/2010 | Heintze et al. |
| 2011/0069021 | A1 | 3/2011 | Hill |
| 2011/0202876 | A1* | 8/2011 | Badger .................. G06F 3/0237 715/816 |
| 2012/0001852 | A1 | 1/2012 | Ho et al. |
| 2012/0068933 | A1 | 3/2012 | Larsen |
| 2012/0212443 | A1 | 8/2012 | Tomimori |
| 2013/0002534 | A1 | 1/2013 | Braun et al. |
| 2013/0021256 | A1* | 1/2013 | Manzen .................. G06F 3/0237 345/168 |
| 2014/0043289 | A1 | 2/2014 | Stern et al. |
| 2014/0160063 | A1* | 6/2014 | Yairi .................. G06F 3/044 345/174 |
| 2014/0317564 | A1 | 10/2014 | Odell et al. |
| 2014/0347312 | A1 | 11/2014 | Siska |
| 2014/0368455 | A1 | 12/2014 | Croisonnier et al. |
| 2015/0052473 | A1 | 2/2015 | Kuscher et al. |
| 2015/0123906 | A1 | 5/2015 | Mehandjiysky et al. |
| 2015/0283943 | A1* | 10/2015 | Huebner ............ H05B 33/0848 362/545 |
| 2015/0297145 | A1 | 10/2015 | Luna et al. |
| 2015/0309589 | A1 | 10/2015 | Chang |
| 2016/0098107 | A1 | 4/2016 | Morrell et al. |
| 2016/0103496 | A1 | 4/2016 | Degner et al. |
| 2016/0147440 | A1 | 5/2016 | Leyon |
| 2016/0231856 | A1* | 8/2016 | Suwald .................. G06F 3/0416 |
| 2017/0090594 | A1 | 3/2017 | Silvanto et al. |
| 2017/0090596 | A1 | 3/2017 | Silvanto et al. |
| 2017/0090597 | A1 | 3/2017 | Silvanto et al. |
| 2017/0090654 | A1 | 3/2017 | Silvanto et al. |
| 2017/0249072 | A1 | 8/2017 | Martin et al. |
| 2017/0315622 | A1 | 11/2017 | Morrell et al. |
| 2018/0011548 | A1 | 1/2018 | Garelli |
| 2019/0025954 | A1 | 1/2019 | Wang et al. |

FOREIGN PATENT DOCUMENTS

| | | |
|---|---|---|
| CN | 101482785 | 7/2009 |
| CN | 101609383 | 12/2009 |
| CN | 101644979 | 2/2010 |
| CN | 201563116 | 8/2010 |
| CN | 102171632 | 8/2011 |
| CN | 102200861 | 9/2011 |
| CN | 102844729 | 12/2012 |
| CN | 103164102 | 6/2013 |
| CN | 103176691 | 6/2013 |
| CN | 203260010 | 10/2013 |
| CN | 103384871 | 11/2013 |
| CN | 103455205 | 12/2013 |
| CN | 103577008 | 2/2014 |
| CN | 104423740 | 3/2015 |
| CN | 104834419 | 8/2015 |
| CN | 104915002 | 9/2015 |
| EP | 0189590 | 6/1986 |
| EP | 2305506 | 4/2011 |
| EP | 2664980 | 11/2013 |
| FR | 2980004 | 3/2013 |
| JP | 2001175415 | 6/2001 |
| TW | 200912612 | 3/2009 |
| TW | 201419112 | 5/2014 |
| WO | WO2007/032949 | 3/2007 |
| WO | WO2011/159519 | 12/2011 |
| WO | WO2014/124173 | 8/2014 |
| WO | WO2014/164628 | 10/2014 |

OTHER PUBLICATIONS

U.S. Appl. No. 15/205,344, filed Jul. 8, 2016, pending.
U.S. Appl. No. 15/258,173, filed Sep. 7, 2016, pending.
U.S. Appl. No. 15/258,863, filed Sep. 7, 2016, pending.

(56) References Cited

OTHER PUBLICATIONS

U.S. Appl. No. 15/261,847, filed Sep. 7, 2016, pending.
U.S. Appl. No. 15/261,924, filed Sep. 10, 2016, pending.
U.S. Appl. No. 15/400,416, filed Jan. 6, 2017, pending.

* cited by examiner

INPUT DEVICE HAVING A DIMENSIONALLY CONFIGURABLE INPUT AREA

FIELD

The described embodiments relate generally to a user input device. More particularly, the present embodiments relate to a user input device having multiple large-area sensing elements used to define an dynamically configurable input area.

BACKGROUND

In computing systems, a user input device may be employed to receive input from a user. Some traditional user input devices include large buttons or keys that are used to receive user input. However, these types of user input devices may lack flexibility or adaptability. Other user input devices may include high-density sensing arrays, which, while adaptable, may be too complex or costly to implement for some implementations.

SUMMARY

Embodiments of the present invention are directed to a user input device having a dimensionally configurable input region. In this regard, in a first aspect, the present disclosure includes a user input device. The user input device includes a first sensing area defined by a first electrode. The user input device further includes a second sensing area defined by the first electrode and a second electrode. The user input device further includes a processing unit. The processing unit may be configured to, in a first mode, execute an operation in response to a touch received in the first sensing area. The processing unit may be configured to, in a second mode, execute the operation in response to the touch received in the second sensing area.

A number of feature refinements and additional features are applicable in the first aspect and contemplated in light of the present disclosure. These feature refinements and additional features may be used individually or in any combination. As such, each of the following features that will be discussed may be, but are not required to be, used with any other feature combination of the first aspect.

For example, in an embodiment, the first mode may occur in response to an initial touch and the second mode may occur in response to multiple subsequent touches. The second electrode may surround the first electrode.

In another embodiment, the user input device may include a sensor configured to detect an environmental condition. The processing unit may be further configured to alternate between the first and the second modes based on the environmental condition.

According to another embodiment, the user input device may include an illumination layer. The illumination layer may be configured to, in the first mode, illuminate the first sensing area. The illumination layer may be configured to, in the second mode, illuminate the second sensing area. The illumination of the first capacitive area and the second capacitive area may be indicative of the operation.

In this regard, a second aspect of the present disclosure includes a method for defining a dimensionally configurable input region. The method includes receiving a touch contact on at least one of a first electrode and a second electrode at a touch-sensitive surface. The method further includes, in response to receiving the touch contact on the first electrode, determining a first weighted output by applying a first weighting factor to a first output of the first electrode. The method further includes, in response to receiving the touch contact on the second electrode, determining a second weighted output by applying a second weighting factor to a second output of the second electrode. The method further includes determining a composite signal using at least one of the first and the second weighted output. The method further includes computing a dimensionally configurable input region based on the composite signal being greater than a threshold value.

A number of feature refinements and additional features are applicable in the second aspect and contemplated in light of the present disclosure. These feature refinements and additional features may be used individually or in any combination. As such, each of the following features that will be discussed may be, but are not required to be, used with any other feature combination of the second aspect.

For example, the composite signal may be a sum of the first and the second weighted outputs. Further, the magnitude of the composite signal may vary based on a location of the touch contact along a path that traverses the first and second electrodes.

In another embodiment, the method may further include measuring an environmental condition. The method may further include modifying the threshold value based on the measured environmental condition. In this regard, the measured environmental condition may include at least one of: (a) an amount of light; and (b) an amount of motion.

In this regard, a third aspect of the present disclosure includes a user input device. The user input device includes a touch-sensitive surface. The touch-sensitive surface includes a first electrode having a first contact area. The touch-sensitive surface includes a second electrode proximate to the first electrode and having a second contact area. The user input device further includes a processing unit operatively connected to the first and the second electrodes. The processing unit may be configured to, in response to an initial touch within the first contact area, generate a first user input signal. The processing unit may be further configured to, in response to a subsequent touch within a combined area defined by the first and second contact areas, generate a second user input signal.

A number of feature refinements and additional features are applicable in the third aspect and contemplated in light of the present disclosure. These feature refinements and additional features may be used individually or in any combination. As such, each of the following features that will be discussed may be, but are not required to be, used with any other feature combination of the third aspect.

For example, in an embodiment, the processing unit may be configured to define a dynamically configurable input area over the touch-sensitive surface. The dynamically configurable input area may include the first contact area and at least a portion of the second contact area. The processing unit may be further configured to enlarge the dynamically configurable input area in response to the subsequent touch.

According to another embodiment, the user input device further includes an illumination layer. The illumination layer may be configured to illuminate a region of the touch-sensitive surface in response to the subsequent touch. The region may correspond to the dynamically configurable input area. In some implementations, a size of the region may be updated in response to a change in a size of the dynamically configurable input area. Additionally or alternatively, the region may be indicative of a function performed in response to the user input signal.

In another embodiment, of the operation is a volume control function. As such, the first and second input signals may increment or decrement the volume of an output device.

In another embodiment, the first electrode may be defined by a first capacitive sensor and the second electrode may be defined by a second capacitive sensor. The second capacitive sensor may be distinct from the first capacitive sensor.

According to another embodiment, the subsequent touch may be received at a portion of the first contact area and a portion of the second contact area. Additionally or alternatively, the subsequent touch may be received at the first contact area or the second contact area.

In one embodiment, the first contact area may be greater than a contact area of an actuating object. Similarly, the second contact area may be greater than a contact area of an actuating object. In either case, the actuating object may cause at least one of the initial touch or the subsequent touch.

In this regard, a fourth aspect of the present disclosure includes a user input device. The user input device includes a first capacitive area defined by a first electrode. The user input device includes a second capacitive area defined by the first electrode and a second electrode. The user input device includes a processing unit. The processing unit may be configured to determine a predicted input accuracy for touch input on the user input device. The processing unit may be further configured to define a dimensionally variable input area within the second capacitive area based on the predicted input accuracy. The processing unit may be further configured to execute an operation in response to receiving touch input within the dimensionally variable input area.

A number of feature refinements and additional features are applicable in the fourth aspect and contemplated in light of the present disclosure. These feature refinements and additional features may be used individually or in any combination. As such, each of the following features that will be discussed may be, but are not required to be, used with any other feature combination of the fourth aspect.

For example, in an embodiment, the predicted input accuracy may correspond to a probability that one of a series of touches may occur outside of the first capacitive area. Additionally or alternatively, the predicted input accuracy may correspond to an estimated spatial variation for multiple touches targeted at the first capacitive area.

In another embodiment, the dimensionally variable input area may be expanded in response to a reduction in the predicted input accuracy. The dimensionally variable input area may be determined based on a threshold value applied to a composite output of the first and second electrodes. The threshold value may be decreased in response to a reduction in the predicted input accuracy.

According to another embodiment, the processing unit may be configured to determine if the touch input is received within the dimensionally variable input area by: (1) determining a first weighted output by applying a first weighting factor to a first output of the first electrode; (2) determining a second weighted output by applying a second weighting factor to a second output of the second electrode; (3) determining a composite signal using at least one of the first and second weighted outputs; and (4) computing the dimensionally variable input area based on the composite signal being greater than a threshold value.

In another embodiment, the processing unit may be further configured to modify the predicted input accuracy based on a measured environmental condition. The predicted input accuracy may be reduced in response to receiving a series of touches targeted at the first capacitive area.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
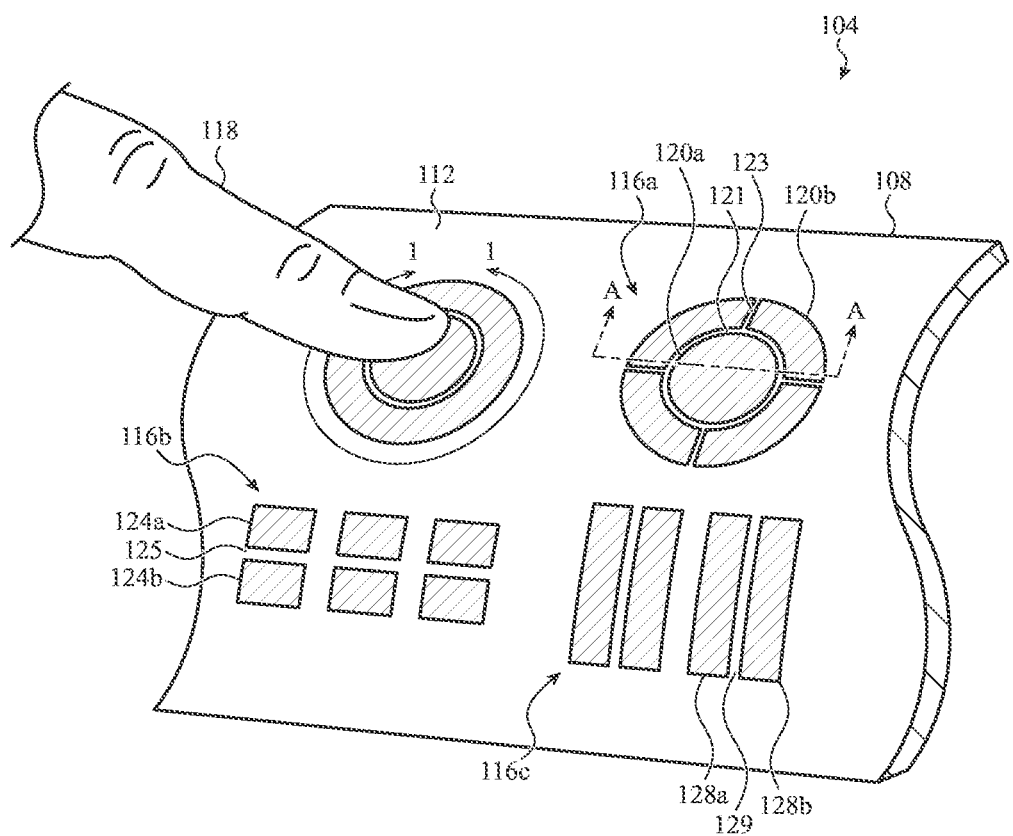
FIG. 1A depicts a user input device having a dimensionally configurable input region, according to one embodiment.

The description that follows includes sample systems, methods, and apparatuses that embody various elements of the present disclosure. However, it should be understood that the described disclosure may be practiced in a variety of forms in addition to those described herein.

The present disclosure describes systems, devices, and techniques related to input devices and, more particularly, to an input structure having a dimensionally configurable input region. The dimensionally configurable input region, as used herein (also referred to as a dynamically configurable input area), may be a surface (or a portion of a surface) on a user input device that is configured to receive a touch input. The touch input may be used to control a computing device.

In a first mode, the dimensionally configurable input region includes a first large-area sensor that may be used to trigger a command or input. In a second mode, the dimensionally configurable input region may be expanded to include the first large-area sensor and a second large-area sensor (or a portion thereof) disposed proximate to the first large-area sensor. In the second mode, one, or both, of the first large-area sensor and the second large-area sensor may be used to trigger a command or input. In some embodiments, the second mode may occur in response to multiple successive touches received at or near the dimensionally configurable input region. In some instances, the second mode may occur in response to a predicted input accuracy that may be determined, for example, based on a probability that one of a series of touch contacts may occur outside of the first large-area sensor.

The term "large-area sensor," as used herein, may be defined as any touch-sensitive sensing element having a contact area that is greater than a contact area of an actuating object. In particular, the contact area of the touch-sensitive sensing element is an area of a discrete electrode (e.g., including a plate, conductor, or other appropriate element) that defines the sensing area of the touch-sensitive sensing element. In this manner, the large-area sensor may have a single, discrete electrode that defines the sensing area. For purposes of the following discussion, the size of the sensing area of a large-area sensor is generally greater than the size of the object used to actuate the sensor. For example, an actuating object may have a contact area defined as a surface area of the actuating object that physically contacts the large-area sensor during a touch contact (e.g., such as a touch contact that causes the large-area sensor to produce an electrical response). The contact area may be less than the area of the large-area sensor. In some cases, the size or area of the sensor (e.g., the single, discrete electrode) may be configured to encompass or surround the contact area of the actuating object during the touch contact.

The term "accuracy," as used herein in the context of a touch input, may refer to the degree to which one of a series of touch inputs falls within a target touch location. The target touch location may correspond to a sensor area associated with a single electrode, multiple electrodes, and/or a dimensionally configurable input region. By way of example, a series of touch inputs having a relatively high degree of accuracy may be characterized as a series of touch inputs in which all or nearly all of the touches fall within the target touch location. Generally, a series of touch inputs having more touches that fall outside of the target touch location may be characterized as having a reduced or diminished accuracy.

As used herein, a "predicted input accuracy" may refer to a prediction that a certain number of touches intended for a target touch location will actually fall within the target touch location. The predicted input accuracy may depend on various factors including, for example, whether the touch input includes a series of touches, the number of touches in the series, or one or more environmental factors that may indicate a user's ability to accurately place a touch is reduced or diminished. In some instances, the predicted accuracy of a series of touch inputs may be based on a probability that one of the series of touch inputs will occur outside of a target touch location. By way of example, a low probability that one or more touch inputs will miss a target touch location may indicate or correspond to a relatively high accuracy. A higher probability that one or more touch inputs will occur outside of a target touch location may correspond to a reduced predicted accuracy. Stated another way, a series of touch inputs with a relatively high degree of accuracy may have a relatively high likelihood that any given touch input of a series of touch inputs occurs inside the dimensionally configurable input region. Similarly, a series of touch inputs with a relatively low degree of accuracy may have a relatively low likelihood that any given touch input of the series of touch input occurs inside the dimensionally configurable input region.

The user input device may compute an estimated spatial variation of the series of touch inputs to determine the probability that one of the series of touch inputs occurs outside of the dimensionally configurable input region. The estimated spatial variation may correspond to an estimated distance or spread between successive touch inputs of a series of touch inputs. In one instance, the user input device may empirically determine the average distance separating successive touch inputs that are associated with a target touch location for a particular condition or scenario. This determination may be used to estimate or predict the spatial variation for similar conditions or scenarios. As explained in greater detail below, the user input device may be configured to enlarge or expand the dimensionally configurable input region in response to a reduced predicted accuracy.

In a particular embodiment, the dimensionally configurable input region may be defined by a variety of types of user input devices. Example devices may include a sensor or electrode array that is integrated into a touch panel, touch screen, track pad, or other user interface device. The user input device may be integrated or incorporated with another component or system including, for example, an electronic or computing device, a keyboard device, an appliance, a dashboard, or any other component that can be adapted to receive user touch input.

The user input device may increase the size of the dimensionally configurable input region. Increasing the size may expand or otherwise enlarge an area of the user input device that is operative to receive a touch input (e.g., such as a touch input that causes the user input device to generate a user input signal). The user input device may increase the size or area of the dimensionally configurable input region by including the second large-area sensor (or a portion thereof) within the dimensionally configurable input region. For example, in response to multiple successive touches received at the dimensionally configurable input region, the user input device may include the second large-area sensor within the dimensionally configurable input region.

In some embodiments, the area of the user input device may increase the total area of the dimensionally configurable input region to reduce the accuracy required by a user to provide a sequence of touch inputs. For example, a user may contact the dimensionally configurable input region multiple times (e.g., via an actuating object, such as a finger) to cause the user input device to generate multiple instances of a user input signal. Successive touch contacts may inadvertently drift or move positions from the initial touch contact (e.g., a user repeatedly contacting a dimensionally configurable input region may inadvertently fail to contact the dimensionally configurable input region in the same location in each instance, despite intending to do so). In this regard, it may be desirable to temporarily increase an area of the dimensionally configurable input region so that less accuracy is required to generate the multiple instances of the user input signal. For example, temporarily increasing the area of the dimensionally configurable input region may allow an actuating object to contact the dimensionally configurable input region at slightly different locations while still causing the user input device to generate the multiple instances of the user input signal.

In order to reduce the accuracy required to perform a touch input or series of touch inputs, the user input device may dynamically increase the area of the dimensionally configurable input region. The dimensionally configurable input region may be expanded from a first large-area sensor to an area that includes some or all of a second large-area sensor. The dimensionally configurable input region may be expanded in response to an indication or prediction that the user may miss or drift from the intended target.

In one embodiment, the user input device may dynamically increase the area of the dimensionally configurable input region based on a predicted input accuracy. The user input device may compute the predicted input accuracy by determining the probability that one of a series of touch contacts may occur outside of the first large-area sensor. The dimensionally configurable input region may include the second large-area sensor (or a portion thereof) in response to the predicted input accuracy being below a predefined value. In this manner, when the user input device predicts that a series of touch contacts may be less accurate or precise, the dimensionally configurable input region may expand to encompass a larger area at which to receive the series of touch contacts. In some cases, the user input device may modify the predicted input accuracy based on a measured environmental condition (e.g., an amount of light, an amount of motion, etc.) that may be indicative of a condition for which the series of touch contacts may be less accurate or precise.

Additionally or alternatively, the dimensionally configurable input region may be expanded to include at least a portion of the second large-area sensor in response to a signal from a computing device. The signal may correspond to or be generated in response to a measured environmental condition (e.g., such as light, motion, and/or image recognition). In this regard, the area of the dimensionally configurable input region may be increased in response to the environmental condition. This may allow the user input device to increase the area of the dimensionally configurable input region, for example, in a low-lighting or high-motion condition, or any other condition in which it may be desirable to reduce the accuracy required to produce a sequence of touch inputs.

In some implementations, the area of the dimensionally configurable input region may be variable or continuously expandable across a region of the user input device defined by the first and the second large-area sensors. In this regard, in one mode, the dimensionally configurable input region may include the first large-area sensor and a portion of the second large-area sensor. Accordingly, the area of the dimensionally configurable input region may be greater than an area of the first large-area sensor and less than a combined area defined by both the first and the second large-area sensors.

To facilitate the foregoing, the area of the dimensionally configurable input region may be dynamically established using a combined output of the first and second large-area sensors. For instance, a touch contact received at the dimensionally configurable input region may generate a first and a second output from the first and second large-area sensors, respectively. In some instances, a weighting factor may be applied to either or both of the first and the second outputs to determine a first and a second weighted output, respectively. The user input device may determine a composite signal using the first and the second weighted outputs. The user input device may then compute the dimensionally configurable input region based on the composite signal being greater than a threshold value. In this regard, the dimensionally configurable input region may include an area encompassing the first and the second large-area sensors at which a touch contact received at any location within the area causes the user input device to generate a composite signal that is greater than the threshold value.

The area of the dimensionally configurable input region may be configurable based on a variety of parameters. For example, the threshold value may be adjusted to reduce or enlarge the area of the dimensionally configurable input region. In one implementation, increasing the threshold value may reduce the size of the dimensionally configurable input region because fewer touch contact locations may be configured to cause a composite signal to be generated that is greater than a threshold value. Similarly, decreasing the threshold value may enlarge the size of the dimensionally configurable input region because more touch contact locations may be configured to cause a composite signal to be generated that is greater than a threshold value.

Additionally or alternatively, the area of the dimensionally configurable input region may be adjusted based on a weighted output determined by applying a weighting factor to an output of one, or both, of the first and the second large-area sensors. For example, the user input device may determine a first weighted output by applying a first weighting factor to an output of the first large-area sensor. The user input device may also determine a second weighted output by applying a second weighting factor to an output of the second large-area sensor. In this regard, the first and/or the second weighting factors may be adjusted to reduce and/or enlarge the area of the dimensionally configurable input region. In one implementation, increasing one and/or both of the weighting factors may enlarge the area of the dimensionally configurable input region because a greater amount of touch contact locations may be configured to cause the user input device to generate a composite signal that is greater than a threshold value. Similarly, decreasing one and/or both of the weighting factors may reduce the area of the dimensionally configurable input region because a reduced amount of touch contact locations may be configured to cause the user input device to generate a composite signal that is greater than a threshold value.

Other implementations and configurations are contemplated and described below. For example, the threshold value and weighting factors may be determined in response to one or more detected environmental conditions. As another example, the first and the second large-area sensors may be defined by various different shapes and configurations, which, in turn, influence the size of the resulting dimensionally configurable input region, including concentric circles, parallel bars, or any other appropriate shape.

A light source may be disposed below the dimensionally configurable input region. The light source may be configured to illuminate portions of the dimensionally configurable input region. For example, the light source may be configured to indicate an increase in the area of the dimensionally configurable input region. As another example, in a first mode, where the dimensionally configurable input region includes the first large-area sensor, the light source may illuminate a contact area of, or associated with, the first large-area sensor. In a second mode, where the dimensionally configurable input region includes the first large-area sensor and the second large-area sensor (or a portion thereof), the light source may illuminate a contact area of, or associated with, the first and/or the second large-area sensors. In some instances, the illumination of the dimensionally configurable input region may be indicative of a function with which the dimensionally configurable input region is associated. For example, the light source may be configured to display an updated set or arrangement of virtual symbols at the dimensionally configurable input region indicative of a function.

Reference will now be made to the accompanying drawings, which assist in illustrating various features of the present disclosure. The following description is presented for purposes of illustration and description. Furthermore, the description is not intended to limit the inventive aspects to the forms disclosed herein. Consequently, variations and modifications commensurate with the following teachings, and skill and knowledge of the relevant art, are within the scope of the present inventive aspects.

FIG. 1A depicts an example user input device 104, such as the user input device generally discussed above and described in more detail below. The user input device 104 includes a touch-sensitive surface configured to receive a touch input to control an electronic device. The user input device 104 may be used with, or incorporated into, a variety of electronic devices. For example, the user input device 104 may be used with substantially any type of electronic device operable to receive user input. Such input may facilitate the device's operation, such as executing a predetermined function or operation in response to the input. Some examples of electronic devices may include a desktop computer, laptop, smart phone, portable media player, or the like. Other examples of electronic devices may include wearable devices (including watches, glasses, rings, or the like), health monitoring devices (including pedometers, heart rate monitors, or the like), and other electronic devices, including digital cameras, printers, scanners, security systems or devices, or electronics for automobiles, among other electronic devices.

The user input device 104 may include one or more dimensionally configurable input regions, for example, such as dimensionally configurable input regions 116a, 116b, and 116c. The dimensionally configurable input regions 116a-116c may be defined by an area of the user input device 104 operative to receive a touch contact that causes the user input device 104 to generate a user input signal. In this regard, each of the dimensionally configurable input regions 116a-116c may include at least one large-area sensor that generates an output in response to a touch contact. In some instances, the dimensionally configurable input regions 116a-116c may include additional large-area sensors (or portions thereof). For example, and as described in greater detail below, a dimensionally configurable input region may be computed by determining a combined output from multiple large-area sensors as being greater than a threshold value. In this manner, the user input device 104 may compute a dimensionally configurable input region such that a touch contact received at a location within the dimensionally configurable input region generates a composite signal that is greater than the threshold value.

In this manner, the dimensionally configurable input regions 116a-116c may be configurable, such that the size, shape, and/or positioning of the input regions may be changed and/or customizable. For example, the size, shape, and/or positioning of the dimensionally configurable input regions 116a-116c may change based on the inclusion of additional large-area sensors (or portions thereof) within the dimensionally configurable input regions 116a-116c. In some instances, the size, shape, and/or positioning of the dimensionally configurable input regions 116a-116c may be customizable based on a user's interactions with the user input device (e.g., in response to multiple successive touch contacts) and/or based on a signal from a computing device (e.g., in response to a measured environmental condition).

To facilitate the foregoing, the user input device 104 may include various large-area sensors. As described above and described in greater detail below (e.g., as described in FIG. 1C), a large-area sensor may be a discrete electrode having a contact area greater than a contact area of an actuating object. For example, as depicted in FIG. 1A, a user's finger may be used as an actuating object that triggers an electrical response from one or more large-area sensors upon a touch contact. Accordingly, each of the large-area sensors of the user input device may have an area that surrounds or otherwise encompasses, for example, a user's finger 118 upon the touch contact.

For example, the user input device 104 may include large-area sensors 120a, 120b. In one implementation, the large-area sensor 120a may be a substantially circular electrode disposed on, or near, a surface of the user input device 104. The large-area sensor 120b may be substantially ring-shaped electrode that surrounds a perimeter of the large-area sensor 120a. The large-area sensors 120a, 120b may be separated by a gap 121 (e.g., a surface of the user input device 104 at which no electrode is present). The dimensionally configurable input region 116a may include one or both of the large-area sensors 120a, 120b. For example, in a first mode, the dimensionally configurable input region 116a may include the large-area sensor 120a. In a second mode, the dimensionally configurable input region 116a may include the large-area sensor 120a and all, or a portion of, the large-area sensor 120b, according to the embodiments described herein.

The large-area sensor 120b may optionally include multiple distinct electrode separated by one or more gaps 123. As shown in FIG. 1A, the gaps 123 may divide the large-area sensor 120b into various distinct quadrants or segments. As shown in FIG. 1A, the large-area sensor 120b may include an array or electrodes that are arranged in a radial pattern. The multiple electrodes may be used to obtain additional locational information about a touch. For example, the large-area sensor 120b may be used to identify a particular quadrant or segment at which a touch contact is received. This may allow the dimensionally configurable input region 116a to identify a direction and/or position of a touch contact when the dimensionally configurable input region 116a includes the large-area sensor 120b (or a portion thereof). As described in more detail with respect to FIGS. 2A-2B and 3A-3B, a location and/or a direction of motion of a touch may be determined using a threshold and composite signal from two or more separate electrodes.

In some embodiments, the direction and/or position of the touch contact may be used to compute the dimensionally configurable input region 116a. To illustrate, the user input device 104 may recognize a pattern of touch inputs as being received at a particular position and compute the dimensionally configurable input region 116a according to the position. To illustrate, the user input device 104 may increase or decrease an area of the dimensionally configurable input region 116a to match or align with the position of the touch inputs.

The user input device 104 may also include large-area sensors 124a, 124b. In an implementation, each of the large-area sensors 124a, 124b may be a substantially square electrode disposed on, or near, a surface of the user input device 104. The large-area sensors 124a, 124b may be disposed proximate to each other and separated by a gap 125. The dimensionally configurable input region 116b may include one or both of the large-area sensors 124a, 124b. For example, in a first mode, the dimensionally configurable input region 116b may include large-area sensor 124a. In a second mode, the dimensionally configurable input region 116b may include the large-area sensor 124a and all, or a portion of, the large-area sensor 124b, according to the embodiments described herein. Example techniques for defining a dynamic or dimensionally configurable input region are described in more detail below with respect to FIGS. 3A-3B.

The user input device 104 may also include large-area sensors 128a, 128b. In an implementation, each of the large-area sensors 128a, 128b may be a substantially rectangular electrode disposed on or near a surface of the user input device 104. The large-area sensors 128a, 128b may be disposed proximate to each other and separated by a gap 129. The dimensionally configurable input region 116c may include one or both of the large-area sensors 128a, 128b. For example, in a first mode, the dimensionally configurable input region 116c may include large-area sensor 128a. In a second mode, the dimensionally configurable input region 116c may include the large area sensor 128a and all, or a portion of, the large-area sensor 128b, according to the embodiments described herein.

It will be appreciated that the foregoing descriptions of the various embodiments of large-area sensors are presented for purposes of illustration only. Other embodiments are contemplated, including large-area sensors having shapes and groupings of shapes different than that of the large-area sensors described above. Additionally, a dimensionally configurable input region may include more than two large-area sensors; for example, a dimensionally configurable input region may include three, four, or more large-area sensors.

The user input device 104 may include a housing 108. The housing 108 may provide an outer casing or covering for a variety of components that support the operation of the user input device 104, including input surfaces, sensing elements, light sources, switches, and/or other hardware, firmware, and/or software components or modules, described in greater detail below.

The housing 108, as shown in FIG. 1, may include a touch-sensitive surface 112. The touch-sensitive surface 112 may be flat and/or contoured in shape depending on the application. The touch-sensitive surface 112 may include concave, convex, or any other number of different geometric forms. The touch-sensitive surface 112 may be shaped to match a contour of an appliance, panel, cockpit, or other element which incorporates the user input device 104. In other embodiments, the touch-sensitive surface 112 may be substantially flat or planar as may be appropriate for a given application. Accordingly, it will be appreciated that the dimensionally configurable input regions 116a-116c may be positioned on, or near, the touch-sensitive surface 112 (or on, or near, any appropriate portion of the housing 108) to perform the various functions described herein.

Figure 1B:
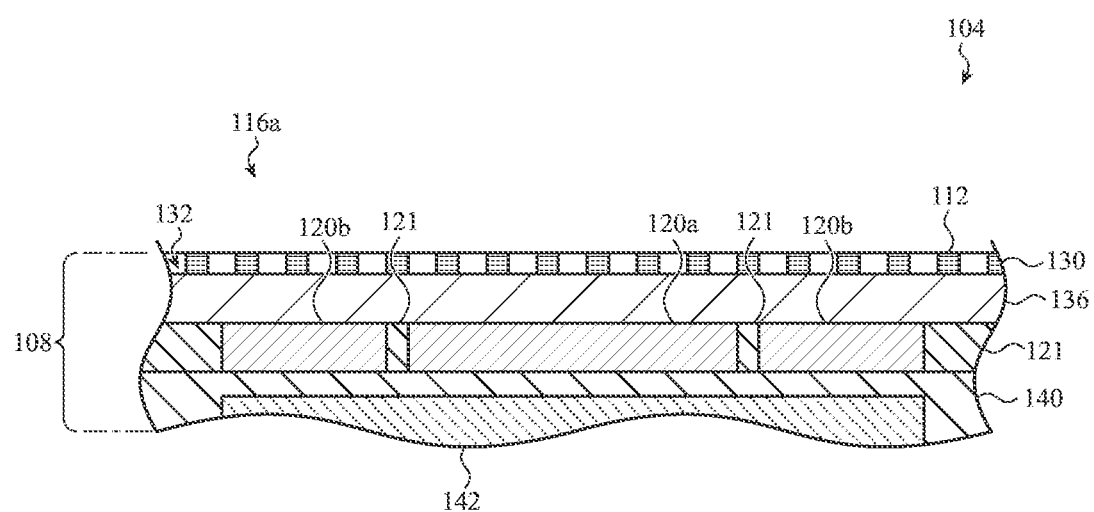
FIG. 1B depicts a cross-sectional view of the embodiment of the user input device of FIG. 1A, taken along the line A-A of FIG. 1.

FIG. 1B is a cross-sectional view of the user input device 104 of FIG. 1A, taken along line A-A of FIG. 1. As illustrated, the housing 108 may define a casing or outer cover of the user input device 104. In this regard, various components may be disposed within the housing 108 to facilitate the operation of the user input device 104, including components for receiving a touch contact at the touch-sensitive surface 112 and generating a corresponding user input signal.

The housing 108 may include a contact layer 130 that defines a top layer of the user input device 104. The top surface of contact layer 130 may be the touch-sensitive surface 112. The contact layer 130 may be constructed from a variety of materials as may be appropriate for a given application. In one instance, the contact layer 130 may be formed from a "soft good" material (e.g., leather, textiles, fibers, vinyl, or the like) that exhibits compliant and flexible characteristics. For example, the contact layer 130 may be substantially compliant and flexible such that it does not permanently deform from applied force (e.g., the contact layer 130 may substantially return to an original or undeformed shape after the force ceases).

In other instances, the contact layer 130 may be formed from a metal, such as an aluminum plate, that may exhibit more rigid characteristics. Additionally or alternatively, the contact layer 130 may be formed from a ceramic, a plastic or other polymer, and/or a fiber-matrix composite, and so on. In some cases, it may be desirable for the contact layer 130 to be substantially transparent, for example, to allow light emitted from within the housing 108 to propagate through the contact layer 130 (e.g., to illuminate the touch-sensitive surface 112). In other instances, the contact layer 130 may include a pattern of microperforations 132 to allow light to propagate through the contact layer 130.

Below the contact layer 130, the housing may include the large-area sensors 120a, 120b. The large-area sensors 120a, 120b may be discrete electrodes of a touch-sensitive element. For example, the large-area sensors 120a, 120b may be conductive plates of a capacitive sensor. In this regard, the large-area sensors 120a, 120b may be constructed to define a self-capacitive configuration. For example, a capacitance may be defined between an actuating object (e.g., a user's finger 118) and one of the plates of the large-area sensors 120a, 120b. The user input device 104 may measure the capacitance at each of the large-area sensors 120a, 120b and generate a corresponding user input signal. This change in capacitance may be due to a touch contact received from an actuating object. In this manner, the user input device 104 may generate a user input signal upon the change in capacitance being greater than a predefined value (e.g., which may be indicative of a touch input at one, or both, of the large-area sensors). Additionally or alternatively, the large-area sensors 120a, 120b may be components of a mutual-capacitive configuration, or other sensor scheme for detecting a touch input using a capacitive sensor.

It will be appreciated that the large-area sensors 120a, 120b need not be limited to a capacitive sensor. The large-area sensors 120a, 120b may include any appropriate large-area sensing element used to detect a touch and/or force input. As one example, the large-area sensors 120a, 120b may be strain-sensitive elements (e.g., a piezoelectric sensor, strain gauge, or the like) that exhibits a change in electrical property in response to a mechanical stress. This may allow the dimensionally configurable input region 116a to receive a force input at one or both of the large-area sensors 120a, 120b. As another example, the large-area sensors 120a, 120b may be components of an inductive sensing configuration. This may allow the dimensionally configurable input region 116a to detect the proximity of an actuating object as it approaches the dimensionally configurable input region 116a. In other embodiments, other sensing configurations are contemplated, including embodiments where the large-area sensors 120a, 120b are components of a resistive sensing configuration and/or an optical sensing configuration. In this regard, while several example large-area sensors 120a, 120b are discussed herein, other large-area sensors are included within the spirt of this disclosure.

The user input device 104 may also include a light source 136 disposed below the contact layer 130. The light source 136 may illuminate a portion of the touch-sensitive surface 112 associated with the dimensionally configurable input region 116a. In this regard, the light source 136 may illuminate the dimensionally configurable input region 116a to indicate an increase and/or a decrease in the area of the dimensionally configurable input region. In other embodiments, the light source 136 may display an adaptable set or arrangement of virtual symbols across the dimensionally configuration input region 116a to indicate a function with which the dimensionally configurable input region is associated. To facilitate the foregoing, the light source 136 may therefore be configured to illuminate a contact area of, or associated with, the large-area sensors 120a, 120b. For example, the light source 136 may include an array of LEDs or other appropriate light-emitting elements that may be configured to illuminate a portion of the touch-sensitive surface 112 associated with the large-area sensors 120a, 120b. In this regard, in an activated state, light emitted from the light source 136 may propagate through the contact layer 130 to illuminate the touch-sensitive surface 112 (e.g., via the pattern of microperforations 132, a transparent portion of contact layer 130, or via any other appropriate mechanism).

The user input device 104 may also include substrate 140. The substrate 140 may be a printed circuit board (PCB) that includes contacts (not shown) for conducting electrical signals. In this regard, the substrate 140 may be coupled with any of the large-area sensors of the user input device 104 (e.g., such as large-area sensors 120a, 120b depicted in FIG. 1B). In this regard, the substrate 140 may receive a signal from, for example, one or both of the large-area sensors 120a, 120b in response to a touch contact. In one embodiment, the substrate 140 may be connected operatively to a processing unit of the user input device 104 (e.g., such as processing unit 608 depicted in FIG. 6). In this regard, the substrate 140 may facilitate the transmission of outputs produced by the large-area sensors 120a, 120b to the processing unit, for example, for use in generating a user input signal. Additionally or alternatively, substrate 140 may be a sensing substrate that includes various components for detecting a touch contact at the touch-sensitive surface 112, including other touch-sensitive elements capacitively coupled to one, or both of, the large-area sensors 120a, 120b. The substrate 140 may optionally include fasteners or other appropriate mechanical connection structures for securing, for example, the large-area sensors 120a, 120b to the substrate 140.

The user input device 104 may also include haptic element 142. The haptic element 142 may provide haptic feedback to the touch-sensitive surface 112, for example, in response to a touch contact. In one example embodiment, the haptic element 142 may provide localized haptic feedback to the dimensionally configurable input region 116a in response to a touch contact received at, or near, the dimensionally configurable input region 116a. Localization of the touch or tactile sensation may be accomplished by providing, in one implementation, a localized tactile vibration or displacement along a portion of the touch-sensitive surface 112. The vibration or displacement may be perceived as, for example, a clicking, popping, and/or other audial or tactile cue to a user. This may be used to provide feedback or a response to a touch input at the dimensionally configurable input region 116a.

The haptic element 142 may provide different types of haptic feedback based on a mode or configuration of the dimensionally configurable input region 116a. For example, the haptic element 142 may provide a first type of haptic feedback (e.g., a first clicking or popping sequence) when the dimensionally configurable input region 116a includes the first large-area sensor 120a. Further, the haptic element 142 may provide a second type of haptic feedback (e.g., a second clicking or popping sequence) when the dimensionally configurable input region 116a includes the first large-area sensor 120a and the second large-area sensor 120b (or a portion thereof). In this manner, the haptic feedback element 142 may be used by the user input device 104 to indicate the area of the dimensionally configurable input region 116a, for example, based on a type of haptic feedback provided by the haptic element 142 in response to a touch contact.

The foregoing discussion of the dimensionally configurable input region 116a (and corresponding large-area sensors 120a, 120b) depicted in FIG. 1B is presented for purposes of illustration only. It will be appreciated that dimensionally configurable input regions 116b, 116c (or other dimensionally configurable input regions of the user input device 104) may operate in a manner substantially analogous to the dimensionally configurable input region 116a. For example, the light source 136, substrate 140, and/or haptic element 142 may operate in connection with the large-area sensors of the dimensionally configurable input regions 116b, 116c to receive a touch contact and generate a user input signal.

Figure 1C:
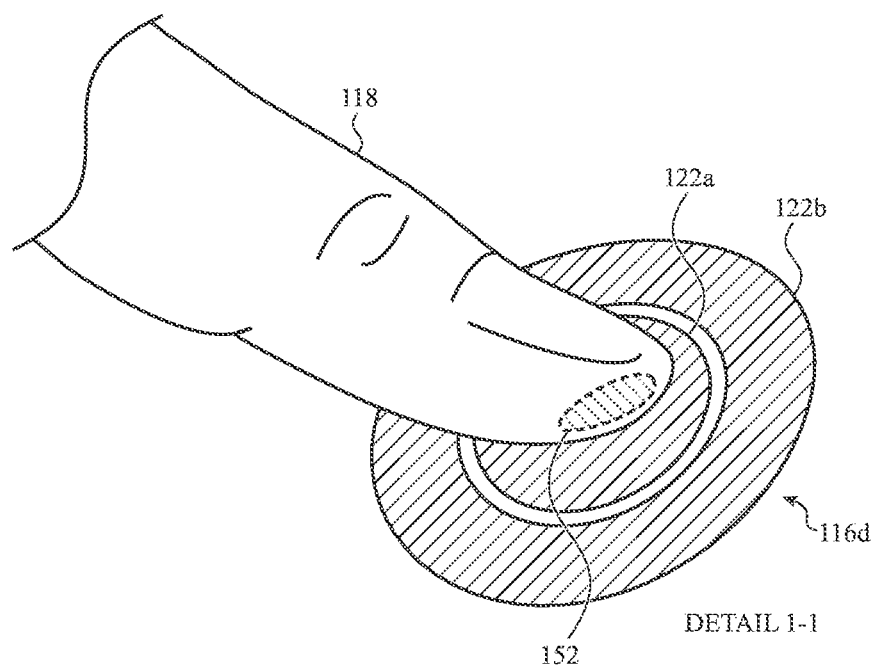
FIG. 1C depicts an enlarged view of a portion of the user input device of FIG. 1A, according to further embodiments.

FIG. 1C depicts detail 1-1 of FIG. 1A of the touch-sensitive surface 112. As shown in the non-limiting example of FIG. 1C, the touch-sensitive surface 112 is shown in a state in which an actuating object (e.g., the finger 118) is contacting a large-area sensor 122a. The large-area sensor 122a may be included in a dimensionally configurable input region 116d. As shown, the large-area sensor 122b may also be included in the dimensionally configurable input region 116d. The large-area sensors 122a, 122b and the dimensionally configurable input region 116d may have a similar structure and function to the large-area sensors 120a, 120b and the dimensionally configurable input region 116a, and/or other sets of large-area sensors or dimensionally configurable input regions of the user input device 104.

An actuating object may physically contact one or more of the large-area sensors discussed herein to produce a touch contact. In this regard, a contact area of an actuating object may be defined as a surface area of the actuating object that physically contacts the large-area sensor during a touch contact. In general, the contact area of the actuating object may be a sufficient size and shape such that the large-area sensor detects a touch contact (e.g., the contact area of the actuating object may be a sufficient size and shape such that the physical contact of the actuating object generates an electrical response indicative of a touch contact). For example, as depicted in FIG. 1C, large-area sensor 122a is depicted in a state in which a touch contact is received from the finger 118. In this regard, a contact area 152 may be an area of the finger 118 (e.g., the actuating object) that is physically contacting the large-area sensor 122a during the depicted touch contact.

According to the embodiments described herein, each large-area sensor of the user input device 104 has a contact area that is greater than a contact area of an actuating object. In this regard, the discrete electrode that defines the contact area of the large-area sensor is larger than the contact area of the actuating object. In some embodiments, for example as depicted in FIG. 1C, the large-area sensor (e.g., such as the large-area sensor 122a) may surround or otherwise encompass the contact area of the actuating object (e.g., contact area 152) when the actuating object physically contacts the large-area sensor.

Additionally or alternatively, the actuating object may contact, for example, two large-area sensors to produce a touch contact at a dimensionally configurable input region that includes two large-area sensors. For example, in an alternative embodiment, the contact area 152 may be disposed over a portion of each of the large-area sensor 122a, 122b to produce a touch contact at the dimensionally configurable user input region 116d. This may be the case, for example, when the dimensionally configurable input region 116d includes the large-area sensor 122a and the large-area sensor 122b (or a portion thereof). Notwithstanding a particular mode or configuration, the discrete electrodes of the large-area sensors 120a, 120b are sufficiently large to encompass the size of the touch contact area of the actuating object. Notably, this is in direct contrast to touch sensitive sensing elements that maximize capacitor electrode density over a touch-sensitive region by substantially diminishing the surface area of any given electrode.

Figure 2A:
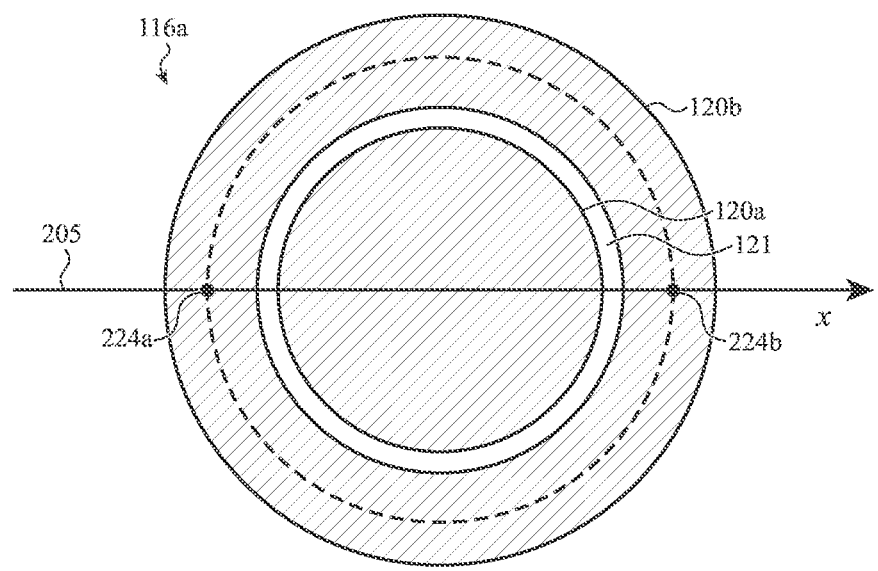
FIG. 2A depicts a dimensionally configurable input region, according to one embodiment.

FIG. 2A depicts an embodiment of the dimensionally configurable input region 116a. As shown, the dimensionally configurable input region 116a may include the large-area sensor 120a and the large-area sensor 120b (or a portion thereof). The large-area sensor 120a may be substantially circular and the large-area sensor 120b may surround the large-area sensor 120a.

The large-area sensors 120a, 120b may produce an electrical response in response to a touch contact. For example, the large-area sensors 120a, 120b may measure a capacitance defined between, for example, one, or both, of the large-area sensors 120a, 120b and an actuating object, such as a user's finger. In this regard, the measured capacitance may be a function of the proximity and positioning of the actuating object relative to one, or both, of the large-area sensors 120a, 120b. Accordingly, as the actuating object approaches, and subsequently travels across, a surface of the large-area sensors 120a, 120b (e.g., traveling between opposing boundaries of the large-area sensor), the large-area sensors 120a, 120b may produce an electrical response based on the change in capacitance caused by the actuating object's proximity and positioning relative to the actuating object.

Figure 2B:
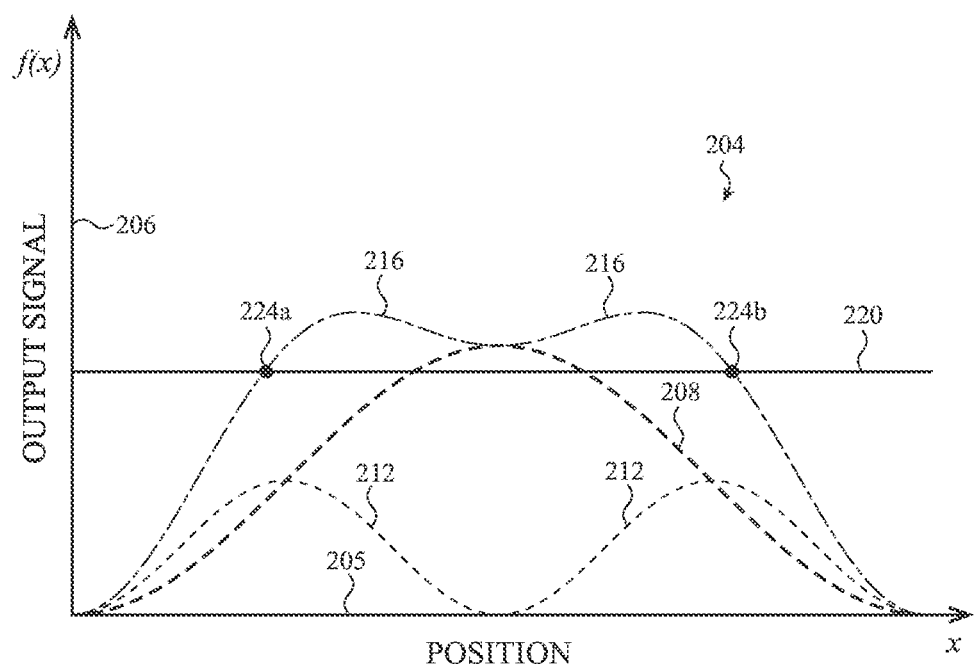
FIG. 2B depicts an electrical response curve of the dimensionally configurable input region of FIG. 2A, according to one embodiment.

FIG. 2B depicts an electrical response diagram 204 that includes information corresponding to the electrical response or output of, with continued reference to FIG. 2A, the large-area sensors 120a, 120b. By way of example, the large-area sensors 120a, 120b may produce an electrical response in response to a touch contact according to one or more curves depicted on electrical response diagram 204. For example, the large-area sensor 120a may produce an electrical response in response to a touch contact according to curve 208. Further, the large-area sensor 120b may produce an electrical response in response to a touch contact according to curve 212.

In this regard, as shown in FIG. 2B, the electrical response of the large-area sensors 120a, 120b may roughly resemble the shape of a normal distribution having a plateaued peak. For example, as the actuating object contacts one of the large-area sensors 120a, 120b, the electrical response of each may rapidly change (e.g., increase). Subsequently, the electrical responses may plateau or stabilize, followed by another rapid change as the actuating object ceases to contact one or both of the large-area sensors 120a, 120b. The plateaued or stabilized electrical response may correspond to a "peak" electrical response produced by the large-area sensors 120a, 120b in response to a touch contact. In some cases, a threshold value may be established such that a touch contact is identified (e.g., by user input device 104) at the large-area sensor when the electrical response is greater than the threshold value.

It will be appreciated that the curves 208, 212 may be at least partially based on the geometry of the large-area sensors 120a, 120b. For example, the curve 208 may have a single distinguishable peak electrical response due to the large-area sensor 120a being substantially circular. Additionally, the curve 212 may have two distinguishable peak electrical responses due to the large-area sensor 120b being substantially ring shaped and surrounding the large-area sensor 120a. Furthermore, the two distinguishable peak electrical responses of the curve 212 may be depicted at diagram 204 on opposites sides of the peak of curve 208, for example, because the large-area sensor 120b may surround the large-area sensor 120a.

In some implementations, the curves 208, 212 may represent a weighted output of the large-area sensors 120a, 120b, respectively. For example, the user input device 104 may determine a first weighted output (as depicted by the curve 208) by applying a first weighting factor to the output of the large-area sensor 120a. Similarly, the user input device 104 may determine a second weighted output (as depicted by the curve 212) by applying a second weighting factor to the output of the large-area sensor 120b. In this regard, as described in greater detail below, the user input device 104 (not shown in FIGS. 2A-2B) may modify the first and/or the second weighting factors such that the large-area sensor 120a produces an electrical response distinct from that of the large-area sensor 120b, for example, in response to the same touch contact.

The electrical response or output depicted by the curves 208, 212 may be plotted on the electrical response diagram 204 as a function of a position of an actuating object relative to each of the set of large-area sensors 120a, 120b. For example, the diagram 204 may include a position axis 205 that corresponds to a lateral cross-dimension of the large-area sensors 120a, 120b. For the sake of example, and with continued reference to FIG. 2A, the position axis 205 may be depicted as being imposed over the set of large-area sensors 120a, 120b to illustrate the relationship between the position of an actuating object at the set of large-area sensors 120a, 120b and the resulting electrical response.

For example, as an actuating object travels across the large-area sensors 120a, 120b in a positive x direction along the position axis 205, the large-area sensors 120a, 120b may produce an output signal. The output signal may be depicted in relation to an output signal axis 206, according to the curves 208, 212. Accordingly, the user input device 104 may identify a touch contact received at the large-area sensor 120a based on the curve 208. Similarly, the user input device 104 may identify a touch contact received at the large-area sensor 120b based on the curve 212.

The dimensionally configurable input region 116a may be configured to operate in various modes to identify a touch contact. For example, the user input device 104 may operate in a first mode in which the dimensionally configurable input region 116a is defined by the large-area sensor 120a. In this regard, a touch contact received within the large-area sensor 120a may cause the user input device 104 to generate a user input signal for controlling a computing device.

As another example, the user input device 104 may operate in a second mode in which the dimensionally configurable input region 116a is defined by the large-area sensor 120a and the large-area sensor 120b (or a portion thereof). In this regard, a touch contact received within either (or both) of the large-area sensors 120a, 120b may cause the user input device 104 to generate a user input signal for controlling a computing device. Accordingly, due to the addition of the large-area sensor 120b, operating the dimensionally configurable input region 116a in the second mode may increase the area of the user input device 104 operative to receive a touch input that causes the user input device 104 to generate the user input signal.

The user input device 104 may operate in the first or the second mode based on a number of factors. For example, the user input device 104 may operate in the second mode (e.g., to increase the area of the dimensionally configurable input region 116a) in response to multiple successive touches received at, or near, the dimensionally configurable input region 116a. In another embodiment, the user input device 104 may operate in the second mode based on a measured environmental condition. For example, the user input device 104 may operate in the second mode in response to one or more of: an ambient light condition; ambient motion condition; or an image recognition condition. In the case of the image recognition condition, the user input device 104 may operate in the second mode based a correlation between a captured image and a stored image or processed image data in order to determine an identity of the user using facial recognition or another similar user-identifying technique. In another embodiment, the user input device 104 may operate in the second mode based on a spontaneous interaction with the user input device 104 (e.g., such as may be detected when a user operates the user input device at an unexpected time).

The user input device 104 may also operate in the second mode based on a predicted input accuracy of a series of touch inputs. This may allow the user input device 104 to increase the area of the dimensionally configurable input region 116a based on a prediction that one or more of the series of touch inputs may occur outside of the dimensionally configurable input region 116a. For example, the user input device 104 may determine the average distance separating successive touch inputs to determine an estimated spatial variation for the series of touch inputs. The estimated spatial variation may indicate that a subsequent touch input of the series of touch inputs may fall outside of the dimensionally configurable input region. The estimated location (or range of locations) of the subsequent touch input may be predicted to exceed or miss the dimensionally configurable input region based on the average distance separating successive touch inputs. Accordingly, the user input device 104 may increase the area of the dimensionally configurable input region 116a to increase the likelihood that the series of touch inputs (or a subset of the touch inputs) will fall within the dimensionally configurable input region 116a. The user input device 104 may therefore generate a user signal corresponding to the series of touch inputs, despite the inaccuracy of the series of touch inputs.

When in the second mode, according to one embodiment, the user input device 104 may compute the dimensionally configurable input region 116a based on a combined output of the large-area sensors 120a, 120b. For example, the dimensionally configurable input region 116a may be computed based on the combined output of the large-area sensors 120a, 120b being greater than a threshold value. In particular, the user input device 104 may determine a composite signal based on the combined output of the electrical response of the large-area sensor 120a (e.g., as depicted by the curve 208) and the electrical response of the large-area sensor 120b (e.g., as depicted by the curve 212). As illustrated in FIG. 2B, diagram 204 depicts a curve 216 that is indicative of such a composite signal that, in this example, is based on the electrical response due to a touch or touches along a path that traverses the large-area sensors 120a, 120b.

The composite signal indicated by the curve 216 may be determined in a variety of manners. For example, the electrical response of the large-area sensor 120a may be added to the electrical response of the large-area sensor 120b (e.g., curve 216 may be the sum of the curves 208, 212). In another embodiment, the electrical response of the large-area sensor 120a may be averaged with the electrical response of the large-area sensor 120b (e.g., the curve 216 may be the average of the curves 208, 212). Other algorithms are contemplated for determining the composite signal as may be appropriate for a given application.

The composite signal may be increased or decreased based on the magnitude of the electrical responses of the large-area sensors 120a, 120b. Accordingly, the electrical responses of the large-area sensors 120a, 120b may be modified by a weighting factor to modify the resulting composite signal. To illustrate, the user input device 104 may determine a first weighted output by applying a first weighting factor to the electrical response of the large-area sensor 120a. Additionally or alternatively, the user input device 104 may determine a second weighted output by applying a second weighting factor to the electrical response of the large-area sensor 120b. Determining a first and/or second weighted output in this manner may be advantageous so that the peak electrical response of the large-area sensors 120a, 120b may be distinct, thereby facilitating the dynamic modification of the composite signal, according to the embodiments described herein. For example, as depicted in FIG. 2B, the curve 212 may depict an output of the large-area sensor 120b that is reduced by a weighting factors of 50%. In such case, a magnitude of the peak electrical response of the large-area sensor 120b may be half of a magnitude of the peak electrical response of the large-area sensor 120a. In some cases, the sum of the weighted outputs results in a generally bell-shaped curve as measured across a path traversing both the large area sensor 120a and the large area sensor 120b.

Figure 6:
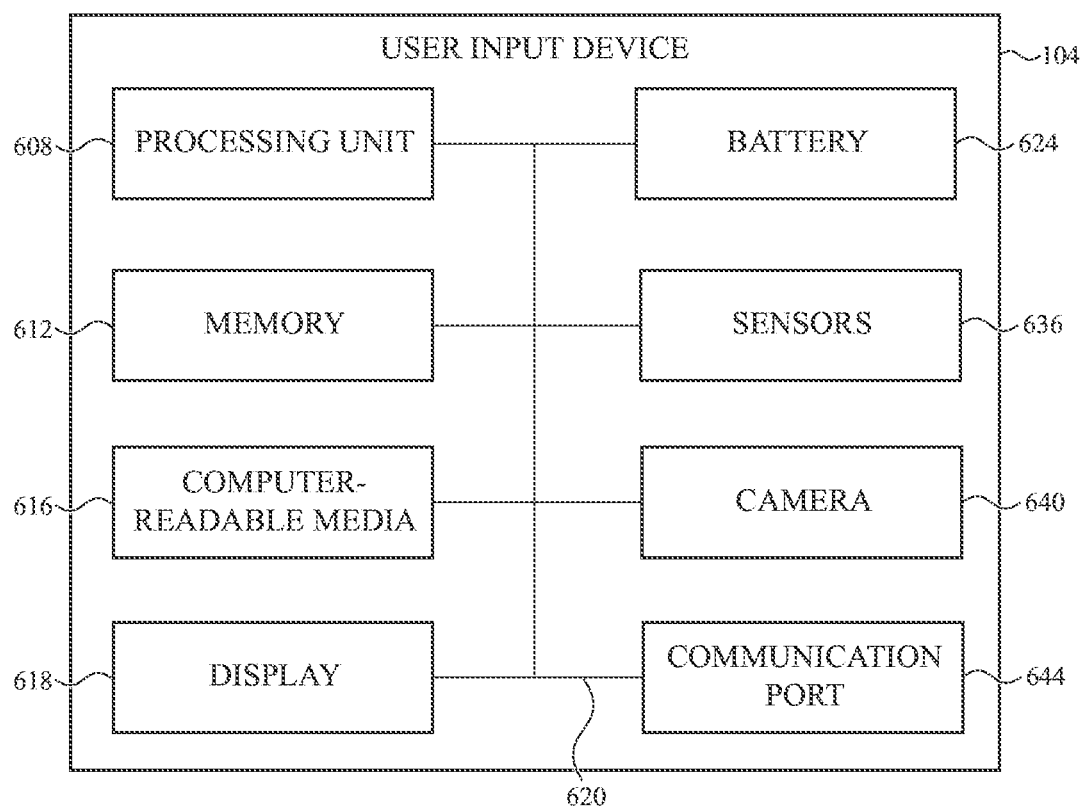
FIG. 6 illustrates an embodiment of a functional block diagram of a user input device.

The dimensionally configurable input region 116a may be computed based on the composite signal, represented by the curve 216, being greater than a threshold value. In this regard, the user input device 104 may identify a touch contact at the dimensionally configurable input region 116a when the composite signal is greater than the threshold value. The threshold value may be any appropriate value, and may be dynamically modified or otherwise updated to change the area of the dimensionally configurable input region 116a. For example, the threshold value may be a predefined value (e.g., as established by a user) and/or a dynamically defined value (e.g., as established in response to one or more measured environmental conditions). In another embodiment, the user input device 104 may determine the threshold value by accessing a customization profile having a set of user preferences (e.g., such as may be stored at memory 612, as depicted in FIG. 6). As depicted according to the embodiment of FIG. 2B, the threshold value may be represented by curve 220.

As shown in diagram 204, the curve 220 may intersect the curve 216 (representative of the composite signal) at two points (e.g., intersections 224a, 224b). The distance along the position axis 205 between the intersections 224a, 224b may correspond to a segment of the curve 216 that is greater than the threshold value. In this regard, the distance along the position axis 205 between the intersections 224a, 224b may correspond to a cross-dimension of the dimensionally configurable input region 116a. To illustrate, and with continued reference to FIG. 2A, the intersections 224a, 224b may be represented at the position axis 205 (which is depicted as being imposed over the large-area sensors 120a, 120b) to represent the cross-dimension of the dimensionally configurable input region 116a. Accordingly, based on the geometry of the large-area sensors 120a, 120b, the dimensionally configurable input region 116a may be substantially circular and have a diameter defined by the distance between the intersections 224a, 224b. Because the curve 220 is generally bell-shaped, the threshold, if defined below any local minima, will define a single continuous configurable input region 116a.

It will be appreciated that the size of the dimensionally configurable input region 116a may be modified based on the threshold value and the combined outputs of the large-area sensors 120a, 120b. For example, the composite signal (depicted by the curve 216) may be increased or decreased by modifying one or both of the outputs of the large-area sensors 120a, 120b by a weighting factor. In this regard, increasing (e.g., amplifying) the composite signal may enlarge the dimensionally configurable input region 116a, for example, by increasing the portion of the composite signal over, or greater than, the threshold value. This may be represented at the electrical response diagram 204 as an increase in the distance between the intersections 224a, 224b. Similarly, decreasing the composite signal may reduce the dimensionally configurable input region 116a, for example, by decreasing the portion of the composite signal over, or greater than, the threshold value. This may be represented at the electrical response diagram 204 as a decrease in the distance between the intersections 224a, 224b.

Additionally or alternatively, the threshold value may be increased or decreased to alter the size of the dimensionally configurable input region 116a. In one implementation, the threshold value may be increased or decreased to alter the size of the dimensionally configurable input region 116a based on the predicted input accuracy of a series of touch contacts. In this regard, increasing the threshold value may reduce the dimensionally configurable input region 116a, for example, by decreasing the portion of the composite signal over, or greater than, the threshold value. This may be represented at the electrical response diagram 204 as a decrease in the distance between the intersections 224a, 224b. Similarly, decreasing the threshold value may increase the dimensionally configurable input region 116a, for example, by increasing the portion of the composite signal over, or greater than, the threshold value. This may be represented at the electrical response diagram 204 as an increase in the distance between the intersections 224a, 224b. Modification of the composite signal and/or the threshold value need not be done in isolation. In some cases, the composite signal and/or the threshold value may be iteratively or dynamically modified in combination to define a dimensionally configurable input region 116a, as may be appropriate for a given application.

In some embodiments, the threshold and/or the weighting factors may be varied or swept over a range of values to determine a location of the contact. For example, the threshold and/or the weighting factor may be incremented or decremented by a small index value over a sweep range until a touch is detected. The threshold and/or weighting factor value(s) that correspond to the initial detection of the touch may be used to compute the location of the touch. Stated another way, the threshold and/or the weighting factors may be varied to expand or contract the configurable input region. The input device may be configured to detect and record the size of the configurable input region as the perimeter of the region passes the touch, which is indicative of the location with respect to the large-area sensors 120a, 120b.

Figure 3A:
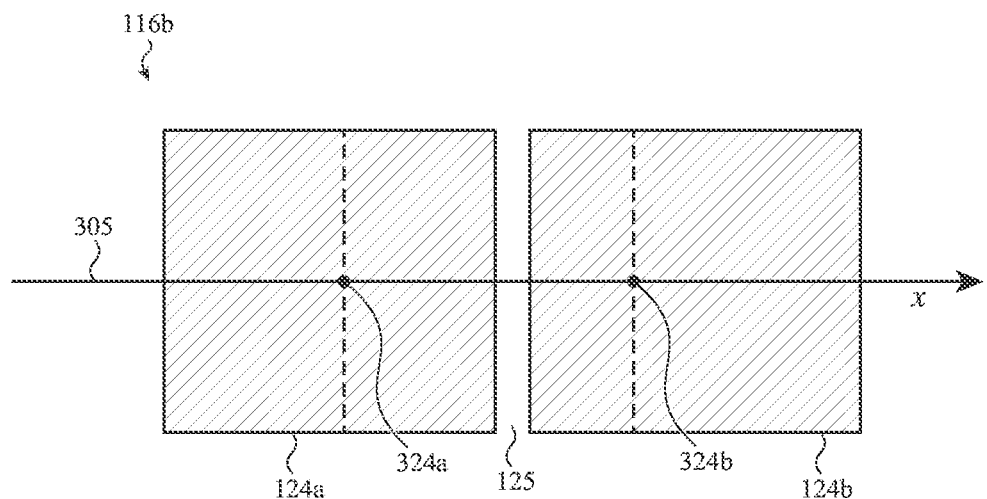
FIG. 3A depicts a dimensionally configurable input region, according to another embodiment.

FIG. 3A depicts an embodiment of the dimensionally configurable input region 116b. As shown, the dimensionally configurable input region 116b may include the large-area sensors 124a, 124b (or portions thereof). The large-area sensors 124a, 124b may be substantially square shaped and disposed proximate to, and separate from, each other. The geometry of the dimensionally configurable input region 116b may be based on the shape and configuration of the large-area sensors 124a, 124b. For example, the dimensionally configurable input region 116b may be substantially square shaped and include a portion of the large-area sensor 124a and a portion of the large-area sensor 124b.

Figure 3B:
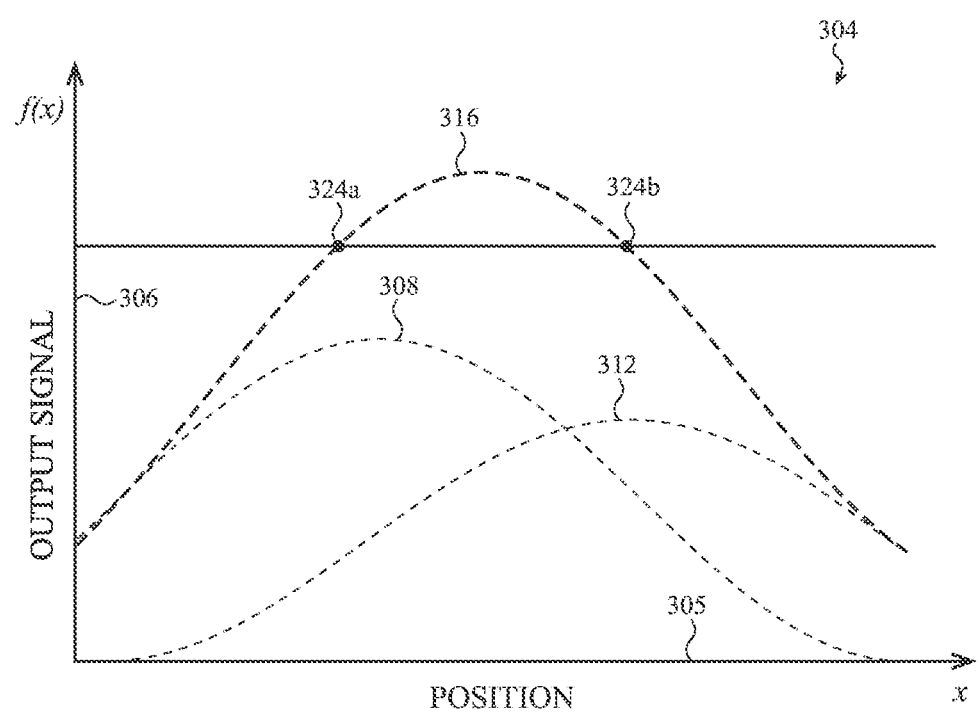
FIG. 3B depicts an electrical response curve of the dimensionally configurable input region of FIG. 3A, according one embodiment.

Similar to the large-area sensors 120a, 120b described in relation to FIGS. 2A-2B, the large-area sensors 124a, 124b may produce an electrical response in response to a touch contact. In this regard, as shown in FIG. 3B, the large-area sensor 124a, 124b may produce an electrical response in response to a touch contact according to one or more curves depicted on electrical response diagram 304. For example, the large-area sensor 124a may produce an electrical response in response to a touch contact according to curve 308. Further, the large-area sensor 124b may produce an electrical response in response to a touch contact according to curve 312. The curves 308, 312 may be at least partially based on the geometry of the large-area sensors 124a, 124b. For example, the curves 308, 312 may each have a single distinguishable "peak" electrical response due to each of the large-area sensors 124a, 124b being substantially square shaped. The peak electrical response of the curve 308 may be depicted at the diagram 304 as adjacent to, and non-overlapping with, the peak electrical response of the curve 312. The depicted electrical responses may be based at least partially on, for example, the large-area sensor 124a being disposed proximate to, and separated from, the large-area sensor 124b.

Analogous to diagram 204 described in relation to FIGS. 2A-2B, the curves 308, 312 may be depicted on the electrical response diagram 304 as a function of a position of an actuating object in relation to the large-area sensors 124a, 124b. For example, the diagram 304 may include a position axis 305 that corresponds to a lateral cross-dimension of the set of large-area sensors 124a, 124b. For the sake of example, and with continued reference to FIG. 3A, the position axis 305 may be depicted as being imposed over the large-area sensors 124a, 124b to illustrate the relationship between the position of the actuating object at the dimensionally configurable input region 116b and the resulting electrical response. Accordingly, the large-area sensors 124a, 124b may produce an output signal (e.g., depicted at an output signal axis 306) according to the curves 308, 312 in response to a touch contact received at a point along the position axis 305.

Analogous to the embodiment described in relation to FIGS. 2A-2B, the user input device 104 may operate in various modes. As one example, in a first mode, the dimensionally configurable input region 116a may include the large-area sensor 124a or the large-area sensor 124b. In a second mode, the dimensionally configurable input region 116b may include the large area sensor 124a and the large-area sensor 124b (or portions thereof).

When in the second mode, according to one embodiment, the user input device 104 may compute the dimensionally configurable input region 116b based on a combined output of the large-area sensors 124a, 124b being greater than a threshold value. In this regard, the user input device 104 may compute the dimensionally configurable input region 116b in a manner substantially analogous to the dimensionally configurable input region 116a, as described in relation to FIGS. 2A-2B. Accordingly, analogous to the elements described in relation to FIGS. 2A-2B, the diagram 304 may include: composite signal curve 316; threshold value curve 320; and intersections 324a, 324b.

The dimensionally configurable input area 116b may include a portion of the large-area sensor 124a and a portion of the large-area sensors 124b based on the composite curve 316 being greater than the threshold value curve 320. In particular, the distance along the position axis 305 between the intersections 324a, 324b may correspond to a segment of the composite signal curve 316 that is greater than the threshold value. In this regard, the distance along the position axis 305 between the intersections 324a, 324b may correspond to a lateral cross-dimension of the dimensionally configurable input region 116b. As shown in FIG. 3A, the intersections 324a, 324b may be represented at the position axis 305, which is depicted as being imposed over the set of large-area sensors 124a, 124b. This may represent the lateral cross-dimension of the dimensionally configurable input region 116b. Accordingly, based on the geometry of the set of large-area sensors 124a, 124b, the dimensionally configurable input region 116b may be substantially square-shaped and have at least one dimension defined by the distance along the position axis 305 between the intersections 324a, 324b.

As shown in FIG. 3B, the composite signal 316 may be modified based on the magnitude of the electrical response depicted by the curves 308, 312. In this regard, the electrical responses of the large-area sensors 124a, 124b may be modified by a weighting factor to modify the resulting composite signal. As depicted in FIG. 3B, the output of the large-area sensor 124a may be modified by a different weighting factor than the output of the large-area sensor 124b. This may cause the composite signal curve 316 to be asymmetrical. In one instance, this may result in the dimensionally configurable input region 116b being asymmetrical with respect to the large-area sensors 124a, 124b. For example, a portion of the large-area sensor 124a that is included in the dimensionally configurable input region 116b may be greater than a portion of the large-area sensor 124b that is included in the dimensionally configurable input region 116b.

It will be appreciated that the dimensionally configurable input region 116b may be modified (e.g., enlarged and/or reduced) based on adjusting the composite signal and/or threshold value, analogous to the techniques described in relation to the embodiments of FIGS. 2A-2B. In particular, the threshold and/or the weighting factors may be varied or swept over a range of values to determine a location of the contact. As described previously, the threshold and/or the weighting factors may be varied to expand or contract the configurable input region. The input device may be configured to detect and record the size of the configurable input region as the perimeter of the region passes the touch, which is indicative of the location with respect to the large-area sensors 124a, 124b.

The above discussion of the dimensionally configurable input regions 116a, 116b, and corresponding sets of large-area sensors, are presented for purposes of illustration only. Other shapes, and grouping of shapes, of large-area sensors may be included in various different ones of dimensionally configurable input regions of the user input device 104 and are contemplated within the scope of the present disclosure.

Figure 4A:
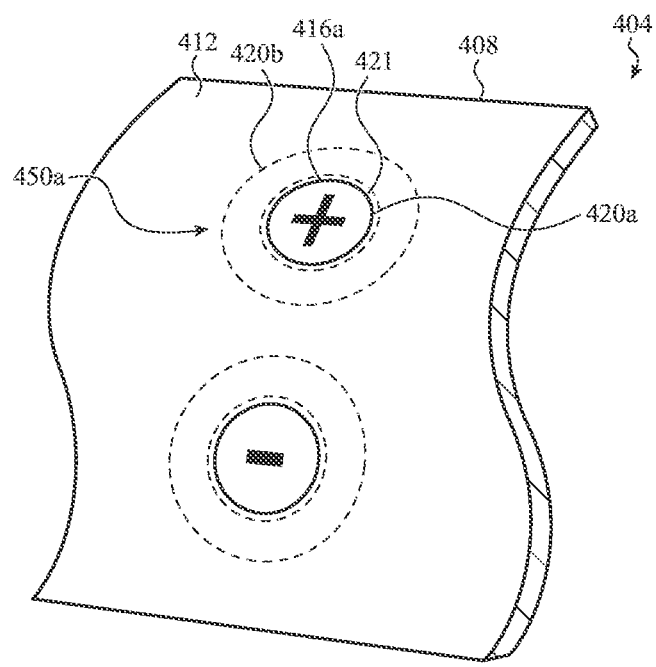
FIG. 4A depicts an embodiment of a dimensionally configurable input region on a user input device, according to one embodiment.
Figure 4B:
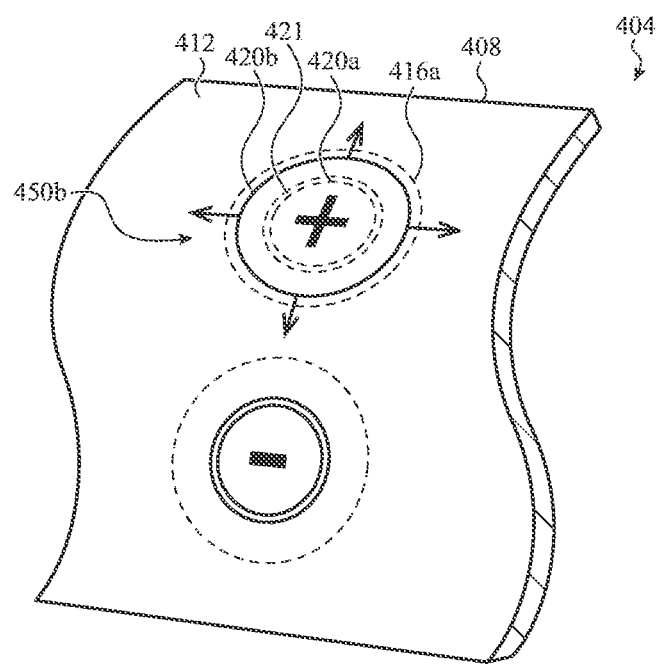
FIG. 4B depicts an embodiment of a dimensionally configurable input region on a user input device, according to another embodiment.
Figure 4C:
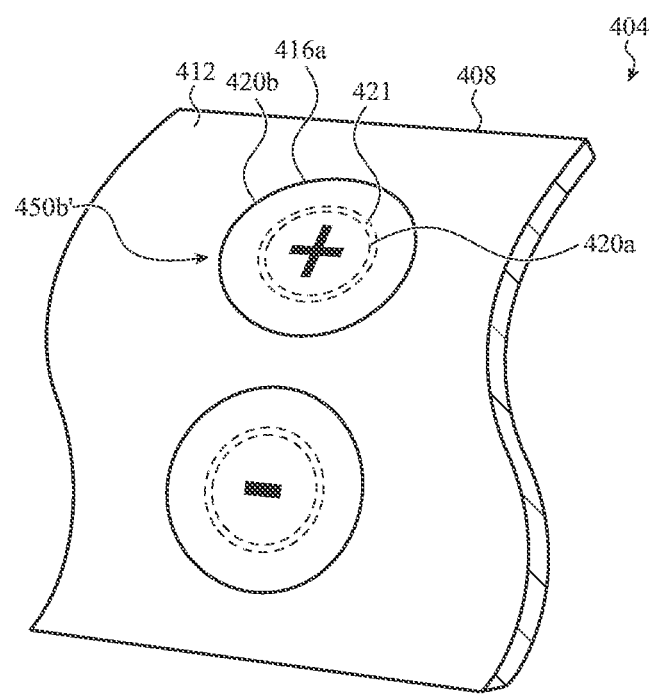
FIG. 4C depicts an embodiment of a dimensionally configurable input region on a user input device, according to another embodiment.

Turning next to FIGS. 4A-4C, a perspective view of a user input device 404 is shown according to various embodiments. The user input device 404 may be substantially analogous to the user input device 104 described in relation to FIGS. 1A-3B. For example, the user input device 404 may have a dimensionally configurable input region that includes one or more large-area sensors. In this regard, analogous to the components described in relation to the embodiments of FIGS. 1A-3B, the user input device 404 may include: housing 408; touch-sensitive surface 412; large-area sensors 420a, 420b; gap 421; and dimensionally configurable input region 416a.

The dimensionally configurable input region 416a may be temporarily expandable in order to increase the surface area at which a touch contact may be received. For example, in a first mode, the dimensionally configurable input region 416a may include large-area sensor 420a. Subsequently, in a second mode, the dimensionally configurable input region 416a may include the large-area sensor 420a and the large-area sensor 420b (or a portion thereof). As described in greater detail above, the user input device 404 may operate in the first or the second mode based on a number of factors, including in response to multiple successive touches received at, or near, the dimensionally configurable input region 416a.

The dimensionally configurable input region 416a may be associated with a function that controls an operation of, for example, a computing device. As illustrated in FIGS. 4A-4C, the dimensionally configurable input region 416a may be associated with a "Volume Up" function, which may be indicated by a "+" symbol (e.g., a function to index or increase the volume of an audio output of a computing device). For example, the dimensionally configurable input region 416a may be illuminated by a light source (not shown in FIGS. 4A-4C) to display the "+" symbol to indicate to a user the function with which the dimensionally configurable input region 416a is associated. In this regard, an actuating object may contact the dimensionally configurable input region 416a in order to cause the user input device 404 to generate a user input signal corresponding to that function.

In some cases, it may be desirable to temporarily increase a size of the dimensionally configurable input region 416a, for example, to reduce the accuracy required by a user to produce a touch input at the dimensionally configurable input region 416a. This may be useful when, for example, an actuating object contacts the dimensionally configurable input region 416a multiple times in order to cause the user input device 404 to generate multiple instances of a user input signal. In the illustrated embodiment of FIGS. 4A-4C, a user may repeatedly contact the dimensionally configurable input region 416a to increase the volume over a range of values. Each touch contact in the sequence of touch contacts may inadvertently drift or move positions from the initial touch contact. Accordingly, the user input device 404 may be configured to modify the size of the dimensionally configurable input region 416a so that a touch contact may be received over an enlarged range of positions, while still causing the user input device 404 to generate the intended multiple instances of the user input signal.

FIG. 4A depicts the user input device 404 in a first mode 450a, in which the dimensionally configurable input region 416a includes the large-area sensor 420a. In the first mode 450a, the user input device 404 may generate a user input signal in response to a touch contact received at the large-area sensor 420a.

FIG. 4B depicts the user input device 104 in a second mode 450b, in which the dimensionally configurable input region 416a includes the large-area sensor 420a and a portion of the large-area sensor 420b. In the second mode 450b, the user input device 404 may generate a user input signal in response to a touch contact received at the large-area sensor 420a and/or a portion of the large-area sensor 420b (e.g., the portion of the large-area sensor 420b that is included within the dimensionally configurable input region 416a). For example, the user input device 404 may compute the dimensionally configurable input region 416a based on the combined output of the large-area sensors 420a, 420b being greater than a threshold value (e.g., as described above in relation to FIGS. 1A-3B). Notably, the dimensionally configurable input region 416a is depicted in FIG. 4B in a state in which the dimensionally configurable input region 416a is expanding. For example, the dimensionally configurable input region 416a may dynamically expand based on a variety of factors, including an identification of a multi-touch sequence, a predicted input accuracy, and/or a measured environmental condition (e.g., such as a measured low-lighting or high-motion condition), according to the embodiments described herein.

FIG. 4C depicts the user input device 404 according to a second mode 450b', in which the dimensionally configurable input region 416a includes the set of large-area sensors 420a, 420b. In the second mode 450b', the user input device 404 may generate a user input signal in response to a touch contact received at either or both of the large-area sensors 420a, 420b.

It will be appreciated that the foregoing descriptions of the volume control button are presented for purposes of illustration only. In other embodiments, the dimensionally configurable input region 116a may be associated with other functions for controlling the computing device. As one non-limiting example, embodiments of the dimensionally configurable input region 416a may be associated with a function for controlling a magnitude of a numerical value represented on a computing device. In this regard, the dimensionally configurable input region 416a may be illuminated by a light source (not shown in FIGS. 4A-4C) to indicate to a user the numeral control function, or any other appropriate function, with which the dimensionally configurable input region 416a is associated.

Figure 5:
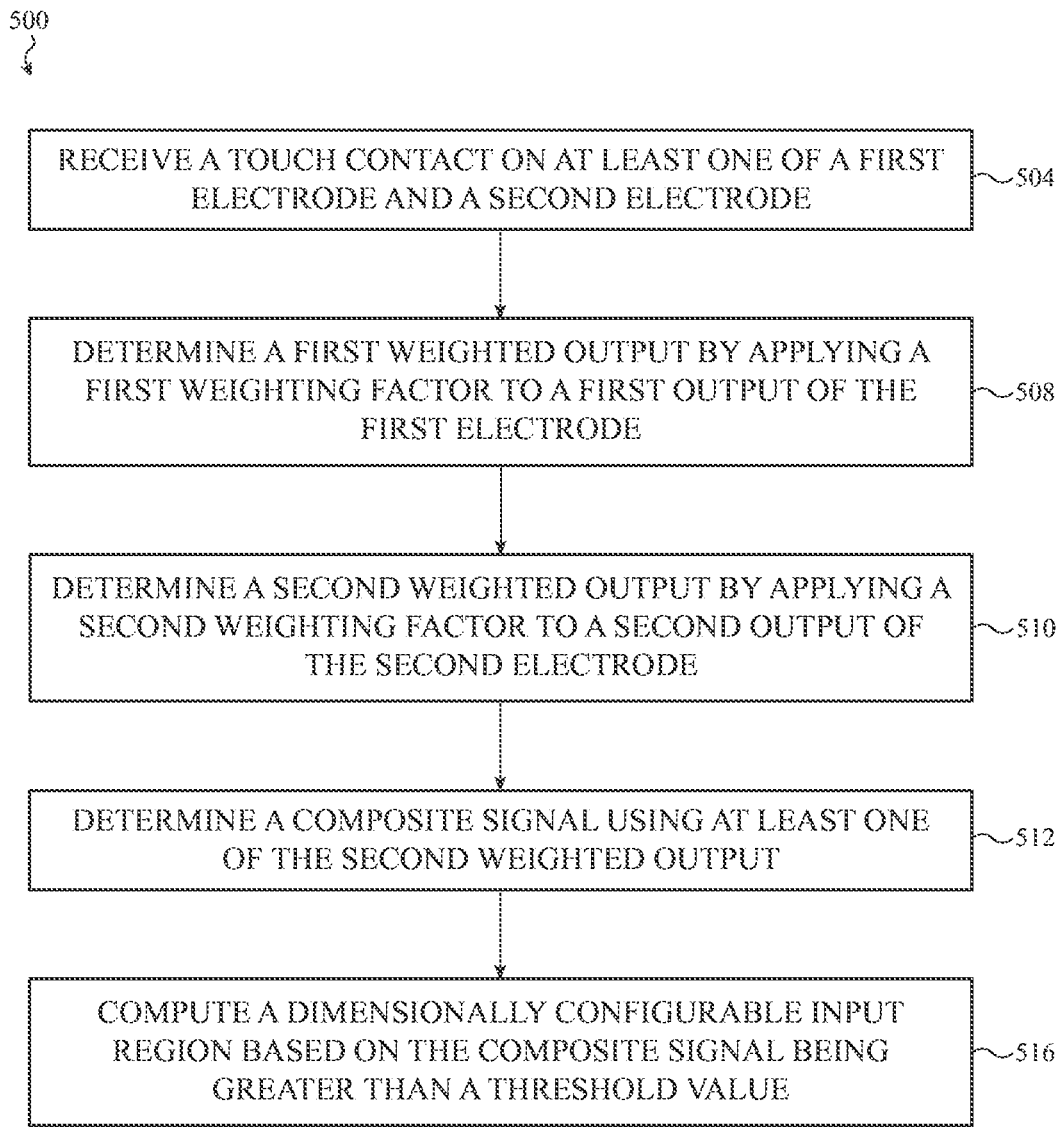
FIG. 5 illustrates a flow diagram of an embodiment of a method for operating a user input device.

To facilitate the reader's understanding of the various functionalities of the embodiments discussed herein, reference is now made to the flow diagram in FIG. 5, which illustrates process 500. While specific steps (and orders of steps) of the methods presented herein have been illustrated and will be discussed, other methods (including more, fewer, or different steps than those illustrated) consistent with the teachings presented herein are also envisioned and encompassed with the present disclosure.

In this regard, with reference to FIG. 5, process 500 relates generally to defining a dimensionally configurable input region. The process may be used in conjunction with the user input device described herein (e.g., such as the user input device 104 described in relation to FIGS. 1A-1C). In particular, a processing unit (e.g., such as the processing unit 608 depicted in FIG. 6) of the user input device may be configured to perform one or more of the example operations described below.

At operation 504, a first output may be received from a first electrode having a first area that is configured to surround a touch contact received from a user. For example and with reference to FIGS. 2A-2B, a processing unit of the user input device 104 may receive a first output (e.g., as indicated by the curve 208) from the large-area sensor 120a. The large-area sensor 120a may surround an actuating object, such as a touch contact received from a user.

At operation 508, a second output may be received from a second electrode having a second area that is configured to surround a touch contact received form a user. For example and with reference to FIGS. 2A-2B, a processing unit of the user input device 104 may receive a second output (e.g., as indicated by the curve 212) from the large-area sensor 120b. The large-area sensor 120b may surround an actuating object, such as a touch contact received from a user. In some cases, for example, when the user fails to contact the large-area sensor 120b, the output of the second electrode may be zero.

At operation 512, a composite signal may be determined using the first output and the second output. For example and with reference to FIGS. 2A-2B, a processing unit of the user input device 104 may determine a composite signal (e.g., as indicated by the curve 216) using the first output from the large-area sensor 120a and the second output from the large-area sensor 120b. In one instance, and as described in relation to FIGS. 2A-2B, the first and second outputs may be modified by a weighting factor to determine the composite signal. For example, a processing unit of the user input device 104 may determine a first weighted output by applying a first weighting factor to the first output. Additionally or alternatively, a processing unit of the user input device 104 may determine a second weighted output by applying a second weighting factor to the second output. In this regard, the composite signal may be determined based on the first and the second weighted outputs (e.g., by adding, averaging, and/or performing another appropriate algorithms using the weighted outputs). In such cases, for example, in which the output of the second electrode is zero, the composite signal may substantially match the output of the first electrode (or the output of the first electrode as modified by a weighting factor).

At operation 516, a dimensionally configurable input region may be computed based on the composite signal being greater than a threshold value. For example and with reference to FIGS. 2A-2B, a processing unit of the user input device 104 may compute the dimensionally configurable input region 116a based on the composite signal (e.g., as represented by the curve 216) being greater than a threshold value (e.g., as represented by the curve 220). As described in greater detail in relation to diagram 204 of FIG. 2B, the curve 216 may intersect the curve 220 at the intersections 224a, 224b. In this regard, a cross-dimension of the dimensionally configurable input region 116a may be defined as the distance between the intersections 224a, 224b. In this regard, the threshold value and the composite signal may be adjusted to modify, for example, the area of the dimensionally configurable input region 116a.

With reference to FIG. 1A, the user input device 104 may have one or more sensors that detect an environmental condition of the user input device 104. The user input device 104 may include various sensors to detect an ambient environmental condition, including: a light sensor configured to detect an ambient light condition; a motion sensor configured to detect an ambient motion condition; and an image sensor used to detect a degree to which an ambient image matches a stored images (e.g., which may be useful for facial recognition or the like). In other embodiments, the user input device 104 may include additional sensors and/or combinations of sensors to detect an ambient environmental condition.

The dimensionally configurable input region 116a may be computed based on the detected environmental condition. As one example, the user input device 104 may enlarge the dimensionally configurable input region 116a based on the detected environmental condition. This may allow the user input device 104 to alternate between a first mode (where the dimensionally configurable input region 116a includes the first large-area sensor 120a) and a second mode (where the dimensionally configurable input region 116a include the first large-area sensor 120a and part, or all, of the second large-area sensor 120b) based on the detected environmental condition.

Computing the dimensionally configurable input region 116a based on a detected environmental condition may allow an area of the dimensionally configurable input region 116a to dynamically change based on a present condition. As such, the dimensionally configurable input region may be enlarged for conditions where it may be desirable to reduce the accuracy required to provide a sequence of touch inputs. As one example, the dimensionally configurable input region 116a may be enlarged in response to detecting a low ambient light condition with the light sensor. As another example, the dimensionally configurable input region 116a may be enlarged in response to detecting a high motion condition with the motion sensor. As another example, the dimensionally configurable input region 116a may be enlarged in response to detecting an image that matches a stored image (e.g., the dimensionally configurable input region 116a may be enlarged in response to an identification of a user). Additionally or alternatively, the dimensionally configurable input region 116a may be minimized or otherwise altered based on the detected environmental condition as may be appropriate for a given application.

The detected environmental condition may be used to determine a predicted input accuracy for a series of touch inputs. For example, the detected environmental condition may be indicative of a circumstance in which a series of touch inputs may be imprecise or have a reduced accuracy. Such circumstance may occur when a high-motion and/or a low-lighting environmental condition is detected at the user input device 104. For example, in a high-motion or low-lighting environmental condition, the probability that one of the series of touch inputs occurs outside of the dimensionally configurable input region 116a may increase. The user input device 104 may therefore enlarge the dimensionally configurable input region 116a to encompass the series of touch inputs based on the predicted input accuracy (e.g., as determined in relation to the detected environmental condition).

FIG. 6 presents a functional block diagram of user input device 104. In this regard, the schematic representation in FIG. 6 may correspond to the user input device 104 depicted in FIGS. 1A-1C, described above. The user input device 104 may include any appropriate hardware (e.g., computing devices, data centers, switches), software (e.g., applications, system programs, engines), network components (e.g., communication paths, interfaces, routers) and the like (not necessarily shown in the interest of clarity) for use in facilitating any appropriate operations disclosed herein.

As shown in FIG. 6, the user input device 104 may include a processing unit 608 operatively connected to computer memory 612 and computer-readable media 616. The processing unit 608 may be operatively connected to the memory 612 and computer-readable media 616 components via an electronic bus or bridge (e.g., such as system bus 620). The processing unit 608 may include one or more computer processors or microcontrollers that are configured to perform operations in response to computer-readable instructions. The processing unit 608 may include the central processing unit (CPU) of the device. Additionally or alternatively, the processing unit 608 may include other processors within the device including application specific integrated chips (ASIC) and other microcontroller devices.

The memory 612 may include a variety of types of non-transitory computer-readable storage media, including, for example, read access memory (RAM), read-only memory (ROM), erasable programmable memory (e.g., EPROM and EEPROM), or flash memory. The memory 612 is configured to store computer-readable instructions, sensor values, and other persistent software elements. Computer-readable media 616 may also include a variety of types of non-transitory computer-readable storage media including, for example, a hard-drive storage device, a solid state storage device, a portable magnetic storage device, or other similar device. The computer-readable media 616 may also be configured to store computer-readable instructions, sensor values, and other persistent software elements.

In this example, the processing unit 608 is operable to read computer-readable instructions stored on the memory 612 and/or computer-readable media 616. The computer-readable instructions may adapt the processing unit 608 to perform the operations or functions described above with respect to FIGS. 1A-5. The computer-readable instructions may be provided as a computer-program product, software application, or the like.

As shown in FIG. 6, the user input device 104 may also include a display 618. The display 618 may include a liquid-crystal display (LCD), organic light emitting diode (OLED) display, light emitting diode (LED) display, or the like. If the display 618 is an LCD, the display may also include a backlight component that can be controlled to provide variable levels of display brightness. If the display 618 is an OLED or LED type display, the brightness of the display 618 may be controlled by modifying the electrical signals that are provided to display elements. In one embodiment, the display 618 may include light source 136 described in relation to FIG. 1B.

The user input device 104 may also include a battery 624 that is configured to provide electrical power to the components of the user input device 104. The battery 624 may include one or more power storage cells that are linked together to provide an internal supply of electrical power. The battery 624 may be operatively coupled to power management circuitry that is configured to provide appropriate voltage and power levels for individual components or groups of components within the user input device 104. The battery 624, via power management circuitry, may be configured to receive power from an external source, such as an AC power outlet or interconnected computing device. The battery 624 may store received power so that the user input device 104 may operate without connection to an external power source for an extended period of time, which may range from several hours to several days.

The user input device 104 may also include one or more sensors 636 that may be used to detect a touch and/or force input, environmental condition, orientation, position, or some other aspect of the user input device 104. Example sensors 636 that may be included in the user input device 104 may include, without limitation, one or more accelerometers, gyrometers, inclinometers, goniometers, or magnetometers. The sensors 636 may also include one or more proximity sensors, such as a magnetic hall-effect sensor, inductive sensor, capacitive sensor, continuity sensor, or the like. In one embodiment, the sensors 636 may include the large-area sensors 120a, 120b described in relation to FIG. 1A. Additionally or alternatively, the user input device 104 may adjust a size of an input region based on one or more outputs from the sensors 636.

The sensors 636 may also be broadly defined to include wireless positioning devices including, without limitation, global positioning system (GPS) circuitry, Wi-Fi circuitry, cellular communication circuitry, and the like. The user input device 104 may also include one or more optical sensors including, without limitation, photodetectors, photosensors, image sensors, infrared sensors, or the like. In one example, the sensor 636 may be an image sensor that detects a degree to which an ambient image matches a stored image. As such, the sensor 636 may be used to identify a user of the user input device 104. The sensors 636 may also include one or more acoustic elements, such as a microphone used alone or in combination with a speaker element. The sensors 636 may also include a temperature sensor, barometer, pressure sensor, altimeter, moisture sensor or other similar environmental sensor. The sensors 636 may also include a light sensor that detects an ambient light condition of the user input device 104.

The sensors 636, either alone or in combination, may generally be a motion sensor that is configured to determine an orientation, position, and/or movement of the user input device 104. For example, the sensor 636 may include one or more motion sensors including, for example, one or more accelerometers, gyrometers, magnetometers, optical sensors, or the like to detect motion. The sensors 636 may also be configured to determine one or more environmental conditions, such as temperature, air pressure, humidity, and so on. The sensors 636, either alone or in combination with other input, may be configured to estimate a property of a supporting surface including, without limitation, a material property, surface property, friction property, or the like.

The user input device 104 may also include a camera 640 that is configured to capture a digital image or other optical data. The camera 640 may include a charge-coupled device, complementary metal oxide (CMOS) device, or other device configured to convert light into electrical signals. The camera 640 may also include one or more light sources, such as a strobe, flash, or other light-emitting device. As discussed above, the camera 640 may be generally categorized as a sensor for detecting optical conditions and/or objects in the proximity of the user input device 104. However, the camera 640 may also be used to create photorealistic images that may be stored in an electronic format, such as JPG, GIF, TIFF, PNG, raw image file, or other similar file types.

The user input device 104 may also include a communication port 644 that is configured to transmit and/or receive signals or electrical communication from an external or separate device. The communication port 644 may be configured to couple to an external device via a cable, adaptor, or other type of electrical connector. In some embodiments, the communication port 644 may be used to couple the user input device 104 with a computing device and/or other appropriate accessories configured to send and/or receive electrical signals. The communication port 644 may be configured to receive identifying information from an external accessory, which may be used to determine a mounting or support configuration. For example, the communication port 644 may be used to determine that the user input device 104 is coupled to a mounting accessory, such as particular type of stand or support structure.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A user input device, comprising:
a first capacitive area defined by a first electrode;
a second capacitive area defined by the first electrode and a second electrode; and
a processing unit operatively connected to the first electrode and the second electrode:
wherein the user input device is configured to:
determine a predicted input accuracy for a touch input on the user input device, the predicted input accuracy based at least in part on two or more successive prior touch inputs applied to the first capacitive area;
define a dimensionally variable input area within the second capacitive area based on the predicted input accuracy; and
execute an operation in response to receiving the touch input within the dimensionally variable input area.

2. The user input device of claim 1, wherein the predicted input accuracy corresponds to a probability that one of a series of touches will occur outside of the first capacitive area.

3. The user input device of claim 1, wherein the dimensionally variable input area is expanded in response to a reduction in the predicted input accuracy.

4. The user input device of claim 1, wherein the dimensionally variable input area corresponds to a threshold value of a composite output of the first and second electrodes.

5. The user input device of claim 4, wherein the threshold value is decreased in response to a reduction in the predicted input accuracy.

6. The user input device of claim 1, wherein:
the user input device is configured to determine if the touch input is received within the dimensionally variable input area by:
determining a first weighted output by applying a first weighting factor to a first output of the first electrode;
determining a second weighted output by applying a second weighting factor to a second output of the second electrode;
determining a composite signal using at least one of the first and second weighted outputs; and
determining that the touch input is received within the dimensionally variable input area if the composite signal is greater than a threshold value.

7. The user input device of claim 1, wherein:
the user input device is further configured to modify the predicted input accuracy based on an amount of light detected by the user input device.

8. The user input device of claim 1, wherein the predicted input accuracy is reduced in response to receiving a series of touches targeted at the first capacitive area.

9. The user input device of claim 1, wherein the user input device is further configured to modify the predicted input accuracy based at least in part on a detected motion of the user input device.

10. A method, comprising:
receiving a touch contact on a touch-sensitive surface defined by a first electrode and a second electrode;
determining a first output of the first electrode;
determining a second output of the second electrode;
applying a weighting factor to either the first output of the first electrode or the second output of the second electrode;
determining a composite signal using the first and second outputs;
in a first mode of operation, determining whether the touch contact is within a first dimensionally configurable input region in response to the composite signal being greater than a first threshold value, the first dimensionally configurable input region having a first size; and
in a second mode of operation, determining whether the touch contact is within a second dimensionally configurable input region in response to the composite signal being greater than a second threshold value that is greater than the first threshold value, the second dimensionally configurable input region having a second size larger than the first size and at least partially encompassing the first dimensionally configurable input region.

11. The method of claim 10, wherein the composite signal is a sum of the first and second outputs.

12. The method of claim 10, wherein a magnitude of the composite signal varies based on a location of the touch contact along a path that traverses the first and second electrodes.

13. The method of claim 10, wherein:
the method further comprises measuring an environmental condition; and
the mode of operation is selected based on the measured environmental condition.

14. The method of claim 13, wherein the measured environmental condition comprises at least one of:
an amount of light; or
an amount of motion.

15. A user input device, comprising:
a first electrode having an outer boundary and defining a first sensing area; and
a second electrode at least partially surrounding the first electrode and having an inner boundary that has a first boundary shape that corresponds to a second boundary shape of the outer boundary of the first electrode, wherein the second electrode and the first electrode define a second sensing area; and the user input device is configured to:
in a first mode, execute an operation in response to a touch received in the first sensing area; and
in a second mode, execute the operation in response to the touch received in the second sensing area.

16. The user input device of claim 15, wherein the second electrode completely surrounds a perimeter of the first sensing area first electrode.

17. The user input device of claim 15, wherein:
the user input device further comprises a motion sensor; and
the user input device is further configured to alternate between the first and the second modes based on a signal from the motion sensor.

18. The user input device of claim 15, wherein:
the user input device further comprises an illumination layer configured to:
in the first mode, illuminate a least a portion of the first sensing area; and
in the second mode, illuminate at least a portion of the second sensing area.

19. The user input device of claim 15, wherein the user input device is further configured to alternate between the first and the second modes based on a change in an environmental condition.

20. The user input device of claim 19, wherein the environmental condition is an ambient motion.

* * * * *